United States Patent
Harris et al.

(10) Patent No.: US 9,523,751 B2
(45) Date of Patent: Dec. 20, 2016

(54) ADAPTIVE ELECTROMAGNET FOR HIGH PERFORMANCE MAGNETIC RESONANCE IMAGING

(71) Applicants: Chad Tyler Harris, Toronto (CA); Alexander Gyles Panther, Toronto (CA); Stephen B. E. McFadyen, Toronto (CA)

(72) Inventors: Chad Tyler Harris, Toronto (CA); Alexander Gyles Panther, Toronto (CA); Stephen B. E. McFadyen, Toronto (CA)

(73) Assignee: SYNAPTIVE MEDICAL (BARBADOS) INC., Bridgetown (BB)

( * ) Notice: Subject to any disclaimer, the term of this patent is extended or adjusted under 35 U.S.C. 154(b) by 0 days.

(21) Appl. No.: 14/898,545

(22) PCT Filed: Apr. 27, 2015

(86) PCT No.: PCT/IB2015/053062
§ 371 (c)(1),
(2) Date: Dec. 15, 2015

(65) Prior Publication Data

US 2016/0313426 A1    Oct. 27, 2016

(51) Int. Cl.
*G01V 3/00* (2006.01)
*G01R 33/54* (2006.01)
*H01F 7/06* (2006.01)
*G01R 33/483* (2006.01)
*G01R 33/36* (2006.01)

(52) U.S. Cl.
CPC ......... *G01R 33/543* (2013.01); *G01R 33/3664* (2013.01); *G01R 33/4833* (2013.01); *H01F 7/064* (2013.01)

(58) Field of Classification Search
CPC .................................................. G01R 33/3664
(Continued)

(56) References Cited

U.S. PATENT DOCUMENTS 6,067,001 A * 5/2000 Xu .................. G01R 33/381
                                                324/319
6,157,280 A   12/2000 Arz et al.
(Continued)

OTHER PUBLICATIONS

Yoda K. (1990). Analytical design method of self-shielded planar coils. J Appl Phys; 67: 4349-4353.
(Continued)

*Primary Examiner* — Louis Arana
(74) *Attorney, Agent, or Firm* — Perry + Currier Inc.

(57) ABSTRACT

A method of configuring a conducting grid of elements interconnected at intersecting nodes by switches is described. The method includes: constructing a background grid by connection of centroids of the cell shape of the conducting grid; identifying a subset of elements in the background grid that intersect the smooth pattern of loops; identifying a subset of elements in the conducting grid that intersect the subset of elements in the background grid; the subset of elements in the conducting grid forming a discretized pattern of loops representing the smooth pattern of loops; for each of the discretized pattern of loops identifying current-in and current-out nodes; altering the on-off state of individual switches in accordance with the discretized pattern of loops; opening the switch between each respective pair of current-in and current out nodes; and applying power to the conducting grid via at least one pair of the input and output current nodes such that the current flow through the elements generates the magnetic field profile.

18 Claims, 23 Drawing Sheets

(58) Field of Classification Search
USPC .................................... 324/318, 322, 314
See application file for complete search history.

(56) References Cited

U.S. PATENT DOCUMENTS

| | | | |
|---|---|---|---|
| 6,278,275 B1 | 8/2001 | Petropoulos et al. | |
| 6,977,502 B1* | 12/2005 | Hertz | G01R 33/3621 324/318 |
| 7,598,740 B2* | 10/2009 | Fischer | G01R 33/3664 324/318 |
| 8,319,495 B1 | 11/2012 | Zhu | |
| 8,390,288 B2* | 3/2013 | Graesslin | G01R 33/288 324/318 |

OTHER PUBLICATIONS

Crozier S., Doddrell D.M. (1993). Gradient-Coil Design by Simulated Annealing. J Magn Reson Ser A; 103: 354-357.

Lemdiasov R.A., Ludwig R. (2005). A Stream Function Method for Gradient Coil Design. Concept Magn Reson B; 26B: 67-80.

Poole M., Bowtell R. (2007). Novel gradient coils designed using the boundary element method. Concept Magn Reson B; 33B: 220-227.

Poole M., et al. (2010). Minimax current density coil design. J Phys D Appl Phys; 43: 095001.

Juchem C., et al. (2011). Dynamic Multi-Coil Shimming of the Human Brain at 7 Tesla. J Magn Reson; 212: 280-288.

Juchem C., et al. (2011). Multi-Coil Shimming of the Mouse Brain. Magn Reson Med; 66: 893-900.

Harris C.T., et al. (2012). Electromagnet design allowing explicit and simultaneous control of minimum wire spacing and field uniformity. Concept Magn Reson B; 41B(4): 120-129.

Harris C.T., et al. (2013). A new approach to shimming: The dynamically controlled adaptive current network. Magn Reson Med; Article first published online (Mar. 15, 2013). [DOI: 10.1002/mrm.24724].

Turner R. (1986). A target field approach to optimal coil design. J Phys D Appl Phys; 19: L147-L151.

Matar, Georges, Examiner, International Search Report, Nov. 10, 2015, PCT/IB2015/053062.

* cited by examiner

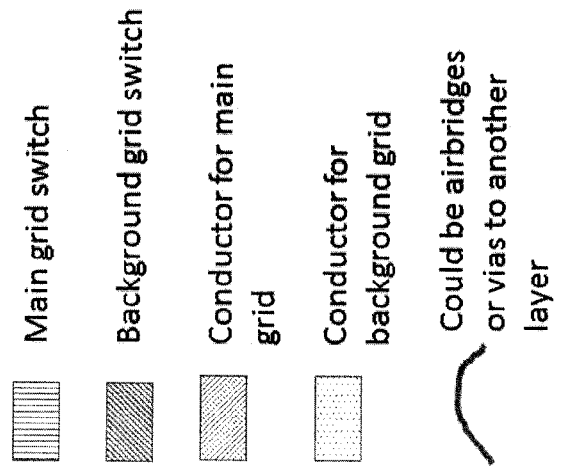
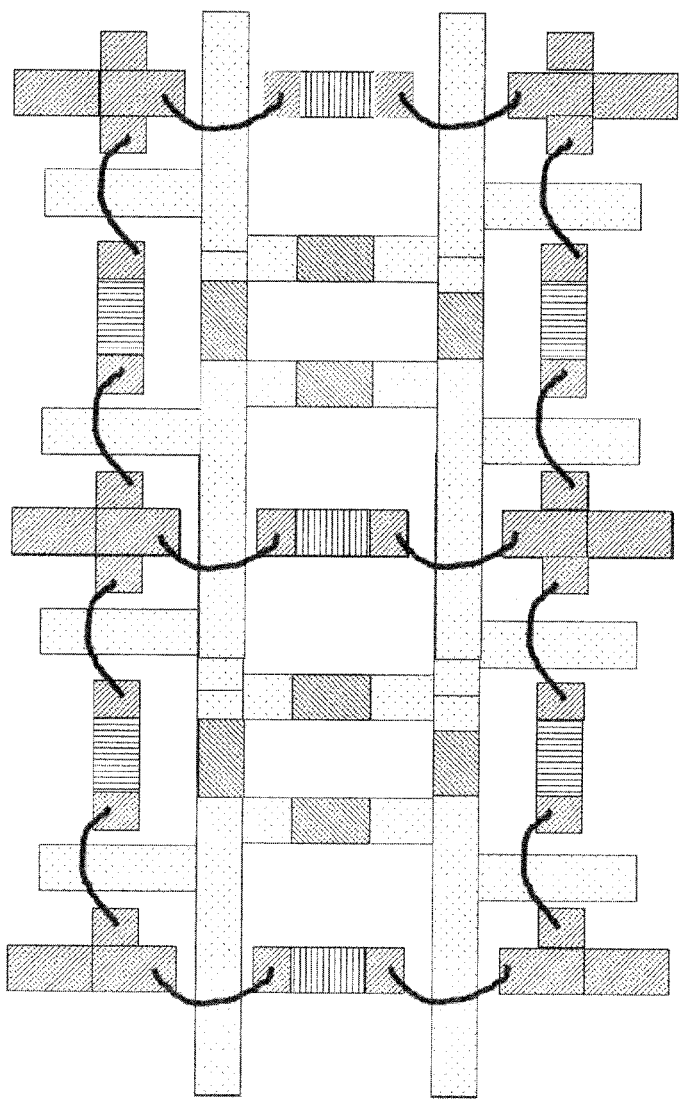
FIG. 23

ADAPTIVE ELECTROMAGNET FOR HIGH PERFORMANCE MAGNETIC RESONANCE IMAGING

FIELD OF THE INVENTION

The present invention relates generally to magnetic resonance imaging. More specifically, the present invention relates to actively controlling the spatial distribution of a magnetic field by use of an electromagnet with an actively controllable current distribution.

BACKGROUND OF THE INVENTION

Magnetic resonance imaging (MRI) is a well known imaging technique that can be used to observe soft tissues such as the brain, muscles and kidneys. Specific properties of the various compounds found inside tissues, such as water and/or fat, are used to generate images. When subjected to a strong magnetic field, the vector sum of the nuclear magnetic moments of a large number of atoms possessing a nuclear spin angular momentum, such as hydrogen, which is abundant in water and fat, will produce a net magnetic moment in alignment with the externally applied field. The resultant net magnetic moment can furthermore precess with a well-defined frequency that is proportional to the applied magnetic field. After excitation by radio frequency (RF) pulses, relaxation mechanisms bring the net magnetization back to its equilibrium position within a characteristic time T1 (also known as the T1 relaxation time), during which a signal can be detected. The resulting MR image is a complex-valued map of the spatial distribution of the transverse magnetization $M_{xy}$ in the sample at a specific time point after an excitation.

In MRI, the main magnetic field is produced by a large superconducting electromagnet. Extreme care is taken to ensure that the magnetic field produced by this magnet is uniform. Non-uniformities can result in signal loss, image distortion, image blurring, and poor fat suppression. In MR spectroscopy, field inhomogeneities cause broadening of line-widths and frequency shifts. Due to these problems, great care is taken at the time of installation to ensure that the field produced by the main magnet is extremely uniform; however, when a subject enters the magnetic environment, additional field inhomogeneities are produced due to susceptibility differences between tissues. This problem is enhanced as the main magnetic field is increased. To achieve the stringent field uniformity requirements necessary for MRI, both passive and active magnetic shims are used to 'fine-tune' the main field in order to make it as uniform as possible. See, for example, Romeo F., Hoult D. I. *Magnet field profiling: analysis and correcting coil design*, Magn Reson Med; 1: 44-65 (1984).

Typically, passive shims are utilized to remove inhomogeneities at the time of installation and active room temperature electromagnets are used to mitigate susceptibility induced field deviations. The active magnetic shim coils traditionally consist of gradient coils (discussed in greater detail below) for first-order linear corrections, and an additional set of electromagnets that produce field patterns matching the second-order spherical harmonics. Some high-field systems contain third or even-fourth order shims. Each shim coil must be powered by its own power supply, typically providing up to 10-20 A of current.

Spatial information in MRI, is encoded by linearly varying the main magnetic field using three room temperature electromagnets known as gradient coils. The gradient coils are typically located just inside the "bore" of the main magnet. The gradient coils produce magnetic fields on the order of mT by passing hundreds of amperes of current through their windings. The power required to create these fields is provided by expensive high-performance power amplifiers.

Due to heating and spatial constraints imposed by gradient coil design criteria, the gradient coil fields can contain non-linearities as much as 50% in extreme cases. The non-linearities result in image warping, which must be undone in post-processing of the image. The strength of whole-body gradient systems is in the range of 20-50 mT/m, with specialized systems boasting strengths of 80-100 mT/m and dedicated diffusion systems capable of 300 mT/m. Slew rates for the gradient systems (i.e. how quickly they can be turned on) are around 200 T/m/s; however, due to the onset of peripheral nerve stimulation (PNS) most scanners are operated at slew rates significantly lower than this.

Harris C. T., et al., *A New Approach to Shimming: The Dynamically Controlled Adaptive Current Network*, Magnetic Resonance Medicine, 71 pp. 859-869 (2014), sets forth a dynamically controlled, active electromagnet that is capable of adaptively changing its wire pattern for the purpose of localized magnetic field shimming. Multiple different spatial profiles can be produced (i.e. both the linear gradients and shim field patterns) using only a single electromagnet powered by a single amplifier, thereby drastically reducing the cost and weight associated with prior art systems. Furthermore, since the adaptive electromagnet can be positioned very close to the patient, lower power is needed for a given field strength, eddy currents induced by switching the magnetic field are reduced if the system is further from the main magnet bore, field inhomogeneities with high spatial frequency can be accounted for, and faster switching without the onset of PNS can be achieved.

A key requirement of the dynamic, adaptive electromagnet set forth in Harris et al. is the ability to represent a continuous current density distribution over a discretized grid of conducting material. However, Harris et al. does not provide any description of how a continuous current density distribution can be transformed into a "discretized" pattern for application to a conducting grid, or any practical implementation of the dynamically controlled adaptive electromagnet.

Additional prior art is relevant to this specification:

Turner R., *A target field approach to optimal coil design*, J Phys D Appl Phys; 19: L147-L151 (1986).

Yoda K., *Analytical design method of self-shielded planar coils*. J Appl Phys; 67: 4349-4353 (1990).

Crozier S., Doddrell D. M. *Gradient-Coil Design by Simulated Annealing*, J Magn Reson Ser A; 103: 354-357 (1993).

Lemdiasov R. A., Ludwig R. *A Stream Function Method for Gradient Coil Design*, Concept Magn Reson B; 26B: 67-80 (2005).

Poole M., Bowtell R. *Novel gradient coils designed using the boundary element method*, Concept Magn Reson B; 33B: 220-227 (2007).

Poole M., et al. *Minimax current density coil design*, J Phys D Appl Phys; 43: 095001 (2010).

Juchem C., et al. (2011). *Multi-Coil Shimming of the Mouse Brain*. Magn Reson Med; 66: 893-900.

Juchem C., et al. (2011). *Dynamic Multi-Coil Shimming of the Human Brain at 7 Tesla*, J Magn Reson; 212: 280-288.

Harris C. T., et al. *Electromagnet design allowing explicit and simultaneous control of minimum wire spacing and field uniformity*, Concept Magn Reson B; 41B(4): 120-129 (2012).

SUMMARY OF THE INVENTION

It is an object of an aspect of the invention to provide a novel system and method for actively controlling the spatial distribution of a magnetic field in an MRI scanning system by use of an adaptive electromagnet, which obviates and mitigates at least one of the above-identified disadvantages of the prior art.

According to one aspect, a method is set forth for transforming a smooth wire pattern to a discretized pattern that can be applied to a conducting grid. According to another aspect, a system and method are set forth for producing a desired current distribution in the conducting grid according to the discretized pattern.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 23 shows a system for supplying power to a second conducting grid via an intermediate third layer where all switches are on the same surface.

DETAILED DESCRIPTION

Figure 1:
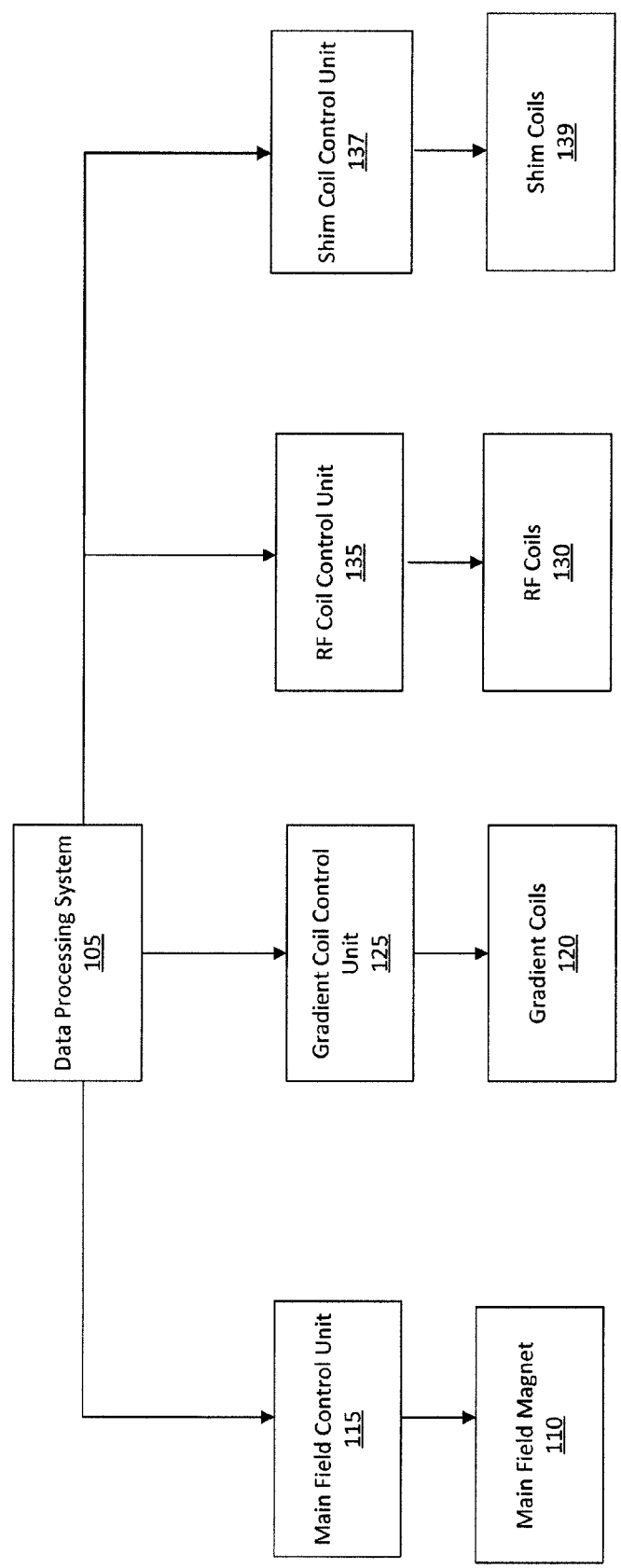
FIG. 1 shows a block diagram of functional subsystems of a magnetic resonance imaging (MRI) system in accordance with an implementation.

Referring to FIG. 1, a block diagram of a magnetic resonance imaging (MRI) system, in accordance with an example implementation, is shown at 100. The example implementation of MRI system indicated at 100 is for illustrative purposes only, and variations including additional, fewer and/or varied components are possible.

As shown in FIG. 1, the illustrative MRI system 100 comprises a data processing system 105. The data processing system 105 can generally include one or more output devices such as a display, one or more input devices such as a keyboard and a mouse as well as one or more processors connected to a memory having volatile and persistent components. The data processing system 105 can further comprise one or more interfaces adapted for communication and data exchange with the hardware components of MRI system 100 used for performing a scan.

Continuing with FIG. 1, example MRI system 100 also includes a main field magnet 110. The main field magnet 110 can be implemented as a permanent, superconducting or a resistive magnet, for example. Other magnet types, including hybrid magnets suitable for use in MRI system 100 will now occur to a person of skill and are contemplated. Main field magnet 110 is operable to produce a substantially uniform main magnetic field having a strength B0 and a direction along an axis. The main magnetic field is used to create an imaging volume within which desired atomic nuclei, such as the protons in hydrogen within water and fat, of an object are magnetically aligned in preparation for a scan. In some implementations, as in this example implementation, a main field control unit 115 in communication with data processing system 105 can be used for controlling the operation of main field magnet 110.

MRI system 100 further includes gradient coils 120 used for encoding spatial information in the main magnetic field along, for example, three perpendicular gradient axes. The size and configuration of the gradient coils 120 can be such that they produce a controlled and uniform linear gradient. For example, three paired orthogonal current-carrying primary coils located within the main field magnet 110 can be designed to produce desired linear-gradient magnetic fields.

In some implementations, gradient coils 120 may be shielded and include an outer layer of shield coils that can produce a magnetic field to counter the gradient magnetic field produced by the primary gradient coils forming a primary-shield coil pair. In such a coil pair the "primary" coils can be responsible for creating the gradient field and the "shield" coils can be responsible for reducing the stray field of the primary coil outside a certain volume such as an imaging volume. The primary and shield coils of the gradient coils 120 may be connected in series. It is also possible to have more than two layers of coils for any given gradient axis that together form a shielded gradient coil. Shielded gradient coils 120 may reduce eddy currents and other interference that can cause artifacts in the scanned images. Since eddy currents mainly flow in conducting components of the MRI system 100 that are caused by magnetic fields outside of the imaging volume (fringe fields), reducing the fringe fields produced by gradient coils 120 may reduce interference. Accordingly, the shapes and sizes, conductor wire patterns and sizes, and current amplitudes and patterns of the primary-shield coil pair can be selected so that the net magnetic field outside the gradient coils 120 is as close to zero as possible. For cylindrical magnets, for example, the two coils can be arranged in the form of concentric cylinders whereas for vertical field magnets, the two coils may be arranged in coaxial disks.

The conductive components of the gradient coils 120, whether shielded or unshielded and including the primary and shield coils, may consist of an electrical conductor (for example copper, aluminum, etc.). The internal electrical connections can be such that when a voltage difference is applied to the terminals of the gradient coils 120, electric current can flow in the desired path. The conductive components for the three gradient axes for both the primary gradient coils and the gradient shield coils can be insulated by physical separation and/or a non-conductive barrier.

The magnetic fields produced by the gradient coils 120, in combination and/or sequentially, can be superimposed on the main magnetic field such that selective spatial excitation of objects occurs within the imaging volume. In addition to allowing spatial excitation, the gradient coils 120 may attach spatially specific frequency and phase information to the atomic nuclei placed within the imaging volume, allowing the resultant MR signal to be reconstructed into a useful image. A gradient coil control unit 125 in communication with data processing system 105 is used to control the operation of gradient coils 120.

As discussed above, magnetic field "shims" may be used to improve the uniformity of the main magnetic field. To perform active shimming (correcting the field distortions that are introduced when different objects are placed within or around the system), corrective electromagnets, such as shim coils 139, carry a current that is used to provide magnetic fields that act to make the main magnetic field more uniform. For example, the fields produced by these coils may aid in the correction of inhomogeneities in the main magnetic field due to imperfections in the main magnet 110, or to the presence of external ferromagnetic objects, or due to susceptibility differences of materials within the imaging region, or any other static or time-varying phenomena. A shim coil control unit 137 in communication with data processing system 105 is used to control the operation of shim coils 139.

Conventionally, magnetic shims fall into two categories: (1) passive shims, composed of strategically placed ferromagnetic material within the magnet bore and/or superconducting electrical circuits within the magnet cryostat, and (2) active shims, composed of additional room-temperature electromagnets. Passive shims are typically used to adjust the main field at the time of initial installation, whereas active shims are used to compensate for the field distortions that are introduced when different objects are placed within the bore of the magnet.

Active shim coils are typically composed of sets of coaxial cylindrical layers, with each layer being a separate current path producing a magnetic field approximating a particular spherical harmonic. By driving different current amplitudes through each shim layer, the resultant additive magnetic field profile can form complicated patterns. This approach to active shimming can require significant amounts of radial space, as each new spherical harmonic produced requires a new cylindrical coil. It also requires multiple power amplifiers, as each cylindrical layer is driven separately. For higher performance, is desirable to use a larger number of spherical harmonics, further increasing radial space, power consumption, and number of amplifiers needed.

As discussed in greater detail below with reference to FIGS. 5-23, a magnetic field shim is set forth in the form of an adaptable electromagnet for actively controlling a magnetic field profile by dynamically adapting the pattern of current flow over a conducting grid.

Returning to FIG. 1, MRI system 100 further comprises radio frequency (RF) coils 130. The RF coils 130 are used to establish an RF magnetic field with strength B1 to excite the atomic nuclei or "spins". The RF coils 130 can also detect signals emitted from the "relaxing" spins within the object being imaged. Accordingly, the RF coils 130 can be in the form of separate transmit and receive coils or a combined transmit and receive coil with a switching mechanism for switching between transmit and receive modes.

The RF coils 130 can be implemented as surface coils, which are typically receive only coils and/or volume coils which can be receive and transmit coils. RF coils 130 can be integrated in the main field magnet 110 bore. Alternatively, RF coils 130 can be implemented in closer proximity to the object to be scanned, such as a head, and can take a shape that approximates the shape of the object, such as a close-fitting helmet. An RF coil control unit 135 in communication with data processing system 100 can be used to control the operation of the RF coils 130.

There are many techniques for obtaining images using a MRI system 100, including T1 and T2 weighted images. To provide a simplified illustration of MRI system 100's functionality, simplified operations for obtaining proton density-weighted images are described as a non-limiting example. To create an image in accordance with the example illustration, MRI system 100 detects the presence of atomic nuclei containing spin angular momentum in an object, such as those of hydrogen protons in water or fat found in tissues, by subjecting the object to a relatively large magnetic field. In this example implementation, the main magnetic field has a strength B0 and the atomic nuclei containing spin angular momentum may be hydrogen protons. The main magnetic field partially polarizes the hydrogen protons in an object placed in the imaging volume of the main magnet 110. The protons are then excited with appropriately tuned RF radiation, forming an RF magnetic field with a strength of B1, for example. Finally, weak RF radiation signal from the excited protons is detected as an MR signal, as the protons "relax"

from the magnetic interaction. The frequency of the detected MR signal is proportional to the magnetic field to which they are subjected.

Cross-sections of the object from which to obtain signals may be selected by producing a magnetic field gradient across the object so that magnetic field values of the main magnetic field can be varied along various locations in the object. Given that the signal frequency is proportional to the varied magnetic field created, the variations allow assigning a particular signal frequency and phase to a location in the object. Accordingly, sufficient information can be found in the obtained MR signals to construct a map of the object in terms of proton presence, which is the basis of a traditional MRI image. For example, since proton density varies with the type of tissue, tissue variations may be mapped as image contrast variations after the obtained signals are processed.

Figure 2:
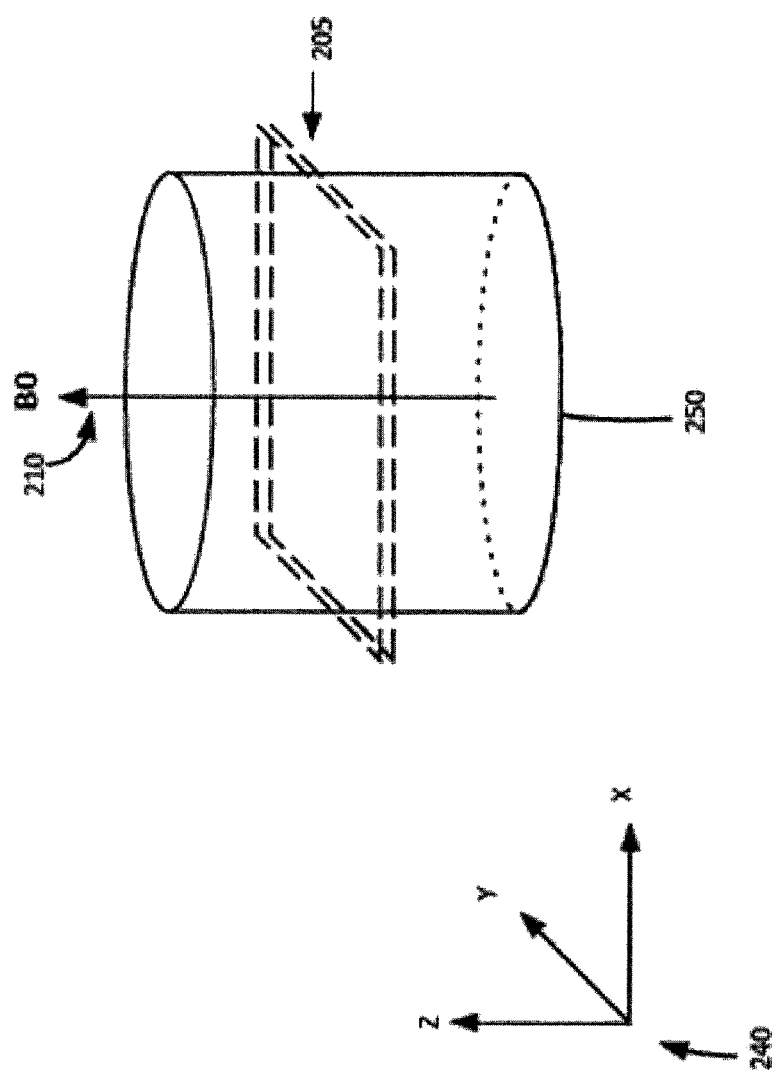
FIG. 2 shows an imaging volume and corresponding slice to be scanned by the MRI system of FIG. 1 in accordance with an implementation.

Referring now to FIG. 2, to further illustrate the example signal acquisition process by the MRI system 100, it is presumed that an object is placed within an imaging volume 250 of the main magnet 110 having a main magnetic field 210 with a strength B0, pointing along the Z-axis indicated at 240. The object subsequently has a net magnetization vector. In this illustrative example, a slice in a plane along the X and Y axes, as indicated at 205, is being imaged. It should be noted that in this example, the slice has a finite thickness along the Z-axis, creating a volumetric slice 205.

To obtain images from the MRI system 100, one or more sets of RF pulses and gradient waveforms (collectively called "pulse sequences") are selected at the data processing system 105. The data processing system 105 passes the selected pulse sequence information to the RF control unit 135 and the gradient control unit 125, which collectively generate the associated waveforms and timings for providing a sequence of pulses to perform a scan.

Figure 3:
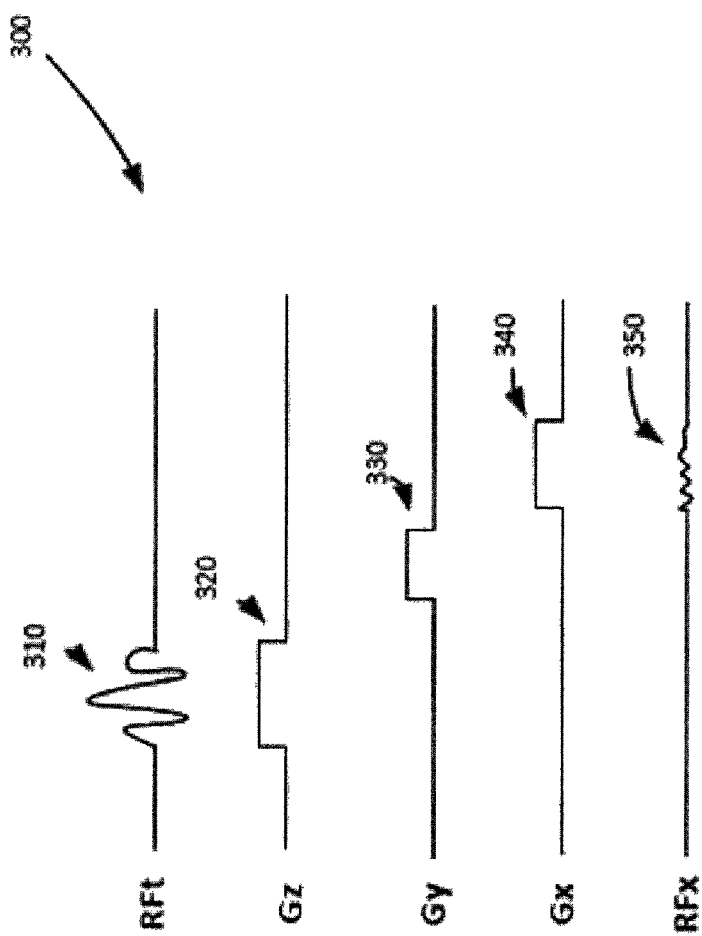
FIG. 3 shows a simplified pulse sequence that may be used by the MRI system of FIG. 1 in accordance with an implementation.

Referring now to FIG. 3, an illustrative pulse sequence 300 is shown that can be used to acquire images using the MRI system 100. Specifically, a timing diagram for the example pulse sequence is indicated at 300. The timing diagram shows pulse or signal magnitudes, as a function of time, for transmitted (RFt) signal, magnetic field gradients $G_x$, $G_y$, and $G_z$ and a received RFx signal. The example pulse sequence, simplified for illustrative purposes, contains a slice selection radio frequency pulse 310 at RFt, a slice selection gradient pulse 320 at Gz, a phase encoding gradient pulse 330 at Gy, a frequency encoding gradient pulse 340 at Gx, as well as a detected MR signal 350 at RFx. The pulses for the three gradients Gx, Gy, and Gz represent the magnitude and duration of the magnetic field gradients that are generated by the gradient coils 120. The slice selection pulse 310 is generated by the transmit aspect of RF coils 130. Detected MR signal 350 is detected by the receive aspect of the RF coils 130. In this illustrative example it is presumed that transmit aspect and receive aspect of RF coils 130 are formed by distinct coils.

The first event to occur in pulse sequence 300 is to turn on the slice selection gradient pulse 320. The slice selection RF pulse 310 is applied at the same time. In this illustrative example, the slice selection RF pulse 310 can be a sinc function shaped burst of RF energy. In other implementations, other RF pulse shapes and durations can be used. Once the slice selection RF pulse 310 is turned off, the slice selection gradient pulse 320 is also turned off and a phase encoding gradient pulse 330 is turned on. Once the phase encoding gradient pulse 330 is turned off, a frequency encoding gradient pulse 340 is turned on and a detected MR signal 350 is recorded. It should be noted that the shapes, magnitudes and durations of the pulses and signals shown in FIG. 3 are chosen for illustrative purposes, and that in implementations, one or more of these factors and other signal factors may be varied to achieve the desired scan results.

In variations, the pulse sequence 300 can be repeated a certain number of times or iterations, for example 256 times, to collect all the data needed to produce one image. Each repetition typically involves variations in the pulse sequence to allow receiving signals corresponding to different components of the image. The time between each repetition of the pulse sequence 300 can be referred to as the repetition time (TR). Moreover, the duration between the center point of the slice selection pulse 310 and the peak of detected MR signal 350 can be referred to as echo time (TE). Both TR and TE can be varied as appropriate for a desired scan.

To further illustrate the signal acquisition process of MRI system 100, FIG. 2 is referred to in conjunction with FIG. 3. To select a slice, the slice selection gradient pulse 320 is applied along the Z-axis, satisfying the resonance condition for the protons located in the slice 205. Indeed, the location of the slice along the Z-axis is determined based, in part, on the slice selective gradient pulse 320. Accordingly, the slice selection pulse 310, generated at the same time as the slice selection gradient pulse 320 can excite protons that are located within the slice 205 in this example. Protons located above and below the slice 205 are typically not affected by the slice selection pulse 310.

Continuing with the illustrative example, in accordance with the pulse sequence 300, a phase encoding gradient pulse 330 is applied after the slice selection gradient pulse 320. Since the gradient pulse 330 creates a gradient in the magnetic field along the Y-axis, the spins at different locations along the Y-axis can begin to precess at different Larmor frequencies. When the phase encoding gradient pulse 320 is turned off, the net magnetization vectors at different locations can precess at the same rate, but possess different phases. The phases can be determined by the duration and magnitude of the phase encoding gradient pulse 330.

Once the phase encoding gradient pulse 330 is turned off, a frequency encoding gradient pulse 340 can be turned on. In this example, the frequency encoding gradient is in the X direction. The frequency encoding gradient can cause protons in the selected slice to precess at rates dependent on their X location. Accordingly, different spatial locations within the slice are now characterized by unique phase angles and precessional frequencies. RF receive coils 130 can be used to receive the detected signal 350 generated by the protons contained in the object being scanned while the frequency encoding gradient pulse 340 is turned on.

Figure 4:
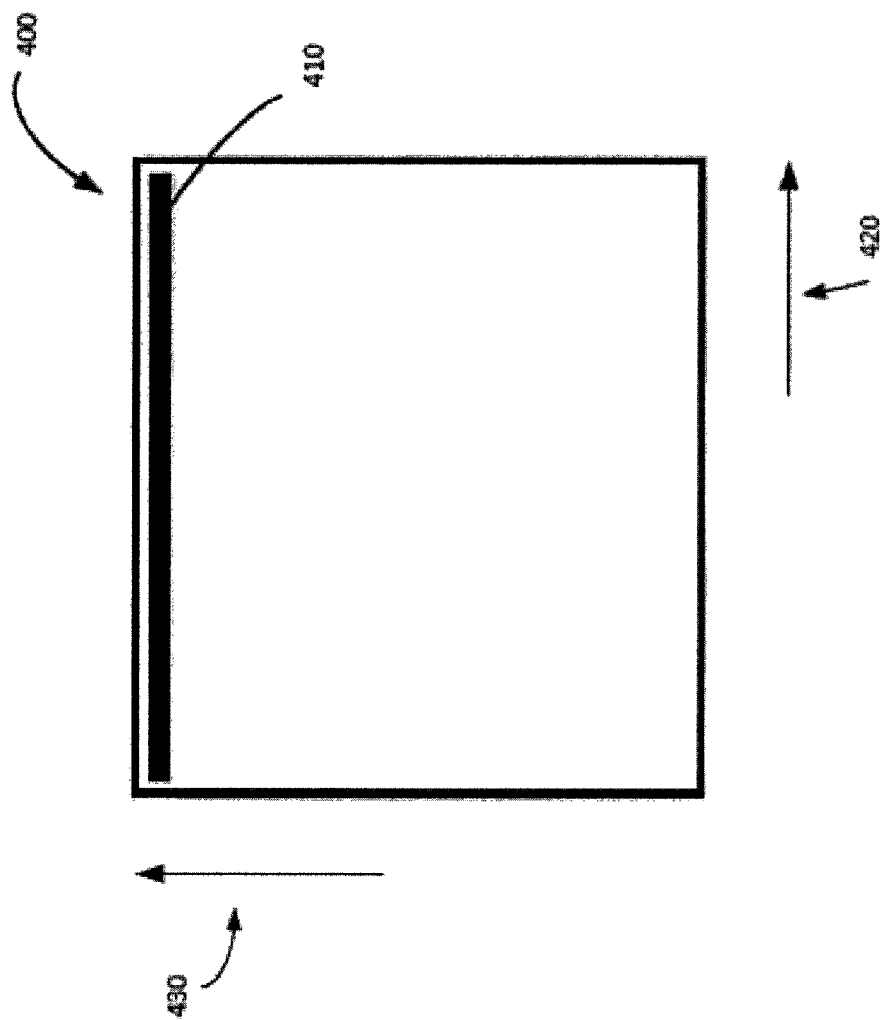
FIG. 4 shows a schematic representation of a k-space data set containing one line received using the MRI system of FIG. 1 in accordance with an implementation.

As the pulse sequence 300 is performed by MRI system 100, the acquired signals can be stored in a temporary matrix referred to as k-space, as shown in FIG. 4 at 400. Typically, K-space is the collection of the detected signals measured for a scan and is in the spatial frequency domain. K-space can be covered by frequency encoding data along the X-axis 420 (Kx) and phase encoding data along the Y-axis 430 (Ky) corresponding to the X and Y axis shown in FIG. 2. When all the lines for the k-space matrix for a slice are received (at the end of the scan of a single slice, for example) the data can be mathematically processed, for example through a two-dimensional Fourier-transform, to produce a final image. Thus, k-space can hold raw data before reconstruction of the image into the spatial domain. K-space is filled with raw data during the scan, typically one line per pulse sequence 300. For example, the first line of k-space 400, indicated at 410, is filled after the completion of the first iteration of the pulse sequence generated for scanning a slice and contains the detected signal for that pulse sequence iteration. After multiple iterations of the pulse sequence, the k-space can be filled. Each iteration of the pulse sequence may be varied slightly, so that signals for the appropriate portions of the k-space are acquired. It should be noted that based on different pulse sequences, other methods of filling the k-space are possible, such as in a spiral manner, and are contemplated.

As discussed above, it is object of an aspect of the invention to provide a novel system and method for actively controlling the spatial distribution of a magnetic field in an MRI scanning system by use of an adaptive electromagnet. According to an embodiment, by modifying current pathways as a function of time, multiple different magnetic field profiles are created with one or more surfaces driven by one or more power supplies. Furthermore, by modifying the current pathways during a pulse sequence, the field profile may be dynamically altered over a localized region of interest (ROI), on a patient-specific basis, in real time.

As discussed in greater detail below, according to an exemplary embodiment conducting switches are placed at the nodes of a conducting grid to adaptively control the current flowing through the grid. By altering the on-off state of the switches, the current flow along different pathways may be controlled, giving rise to multiple different magnetic field profiles.

In one embodiment, a set of pre-defined current paths can be stored in the shim coil control unit 137, which can then switch between the different pre-defined current paths in a time-varying manner. In this embodiment multiple sets of either those switches that are to be activated, or switches that are to be deactivated, or both, can be stored in shim coil control unit 137.

In another embodiment, a current path (or wire pattern) is created in such a way so as to produce a desired magnetic field profile. This wire pattern can be created by a variety of methods, as set forth for example in Turner R.: *A target field approach to optimal coil design*, J Phys D Appl Phys; 19: L147-L151, Crozier S., Doddrell D. M.: *Gradient-Coil Design by Simulated Annealing*, J Magn Reson Ser A; 103: 354-357, Lemdiasov R. A., Ludwig R.: *A Stream Function Method for Gradient Coil Design*, Concept Magn Reson B; 26B: 67-80, or Poole M., Bowtell R.: *Novel gradient coils designed using the boundary element method*, Concept Magn Reson B; 33B: 220-227. All of these approaches result in a smooth wire pattern, that is, the wires can flow anywhere over the surface as opposed to a pattern that has been restricted over a pre-determined conducting grid. The next step in this embodiment is to transform the smooth wire pattern to one that can be represented on a discretized conducting grid 500. FIGS. 5-19, and the accompanying description below, set forth a computationally efficient, robust, method for discretizing a smooth wire pattern for application to the conducting grid.

Figure 5:
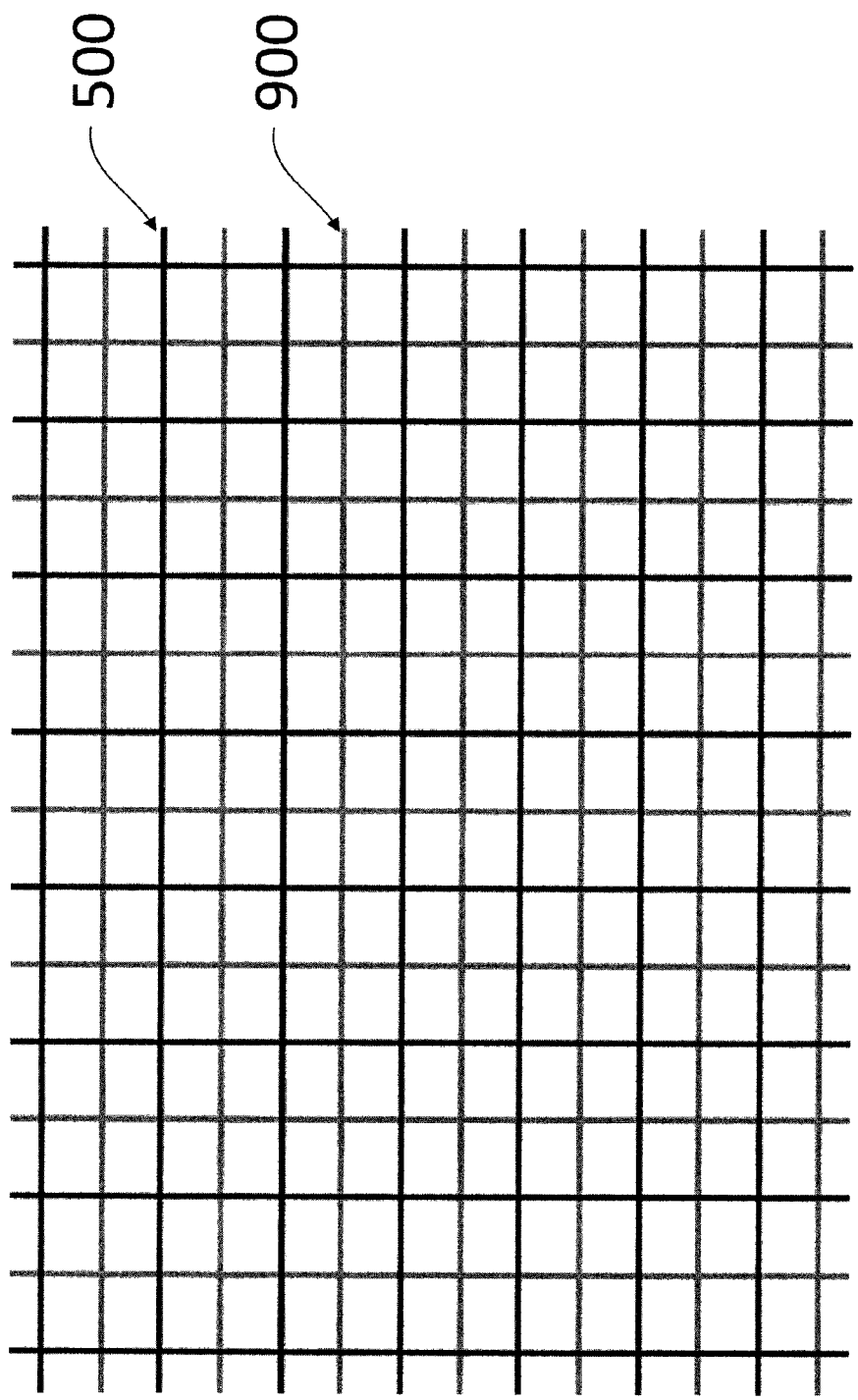
FIG. 5 shows an exemplary rectangular conducting grid and a background grid offset by one half-grid spacing relative to the exemplary rectangular conducting grid, in accordance with an embodiment.
Figure 6:
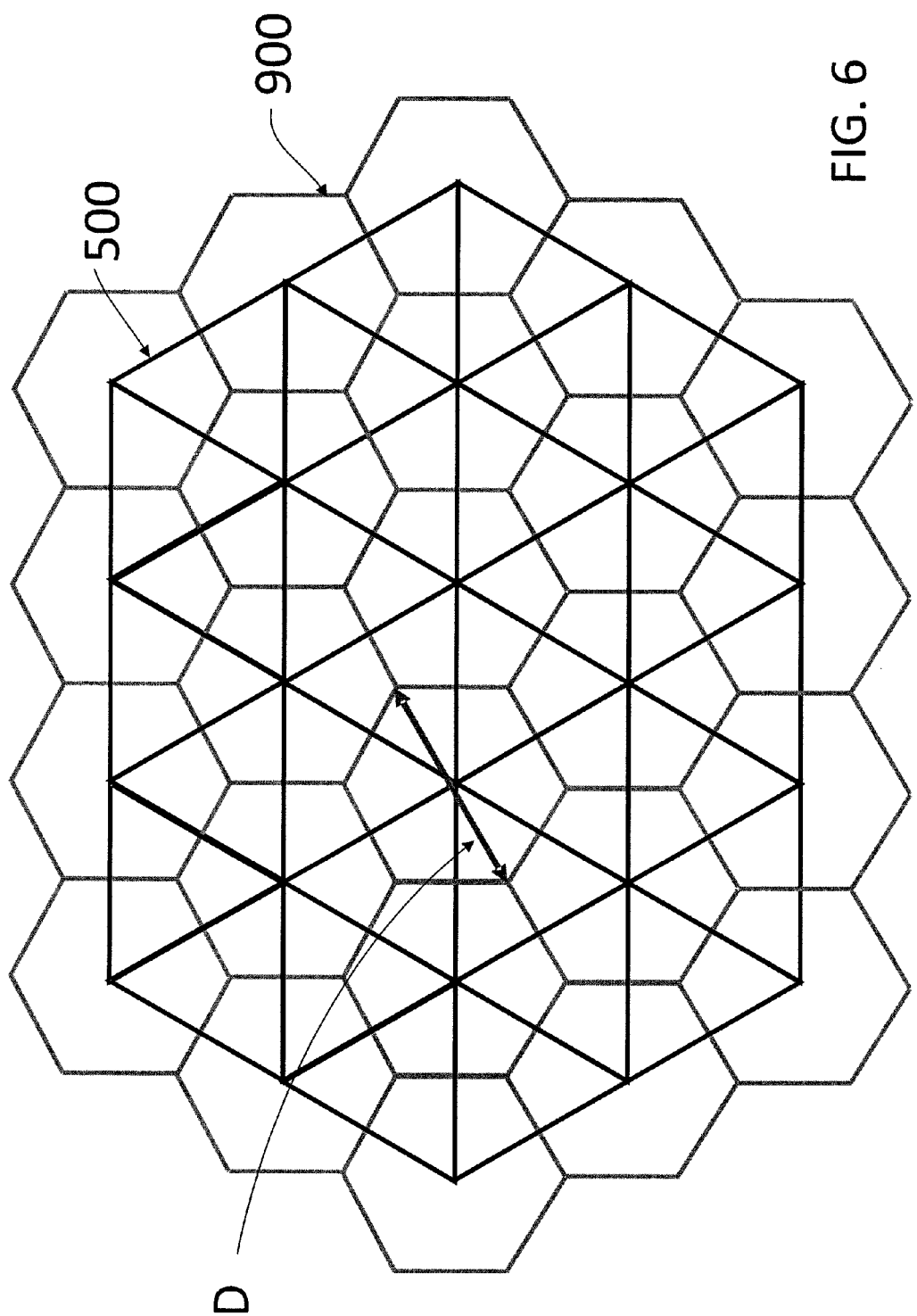
FIG. 6 shows a triangular pattern of conducting grid and hexagonal pattern of background grid, in accordance with an embodiment.
Figure 7:
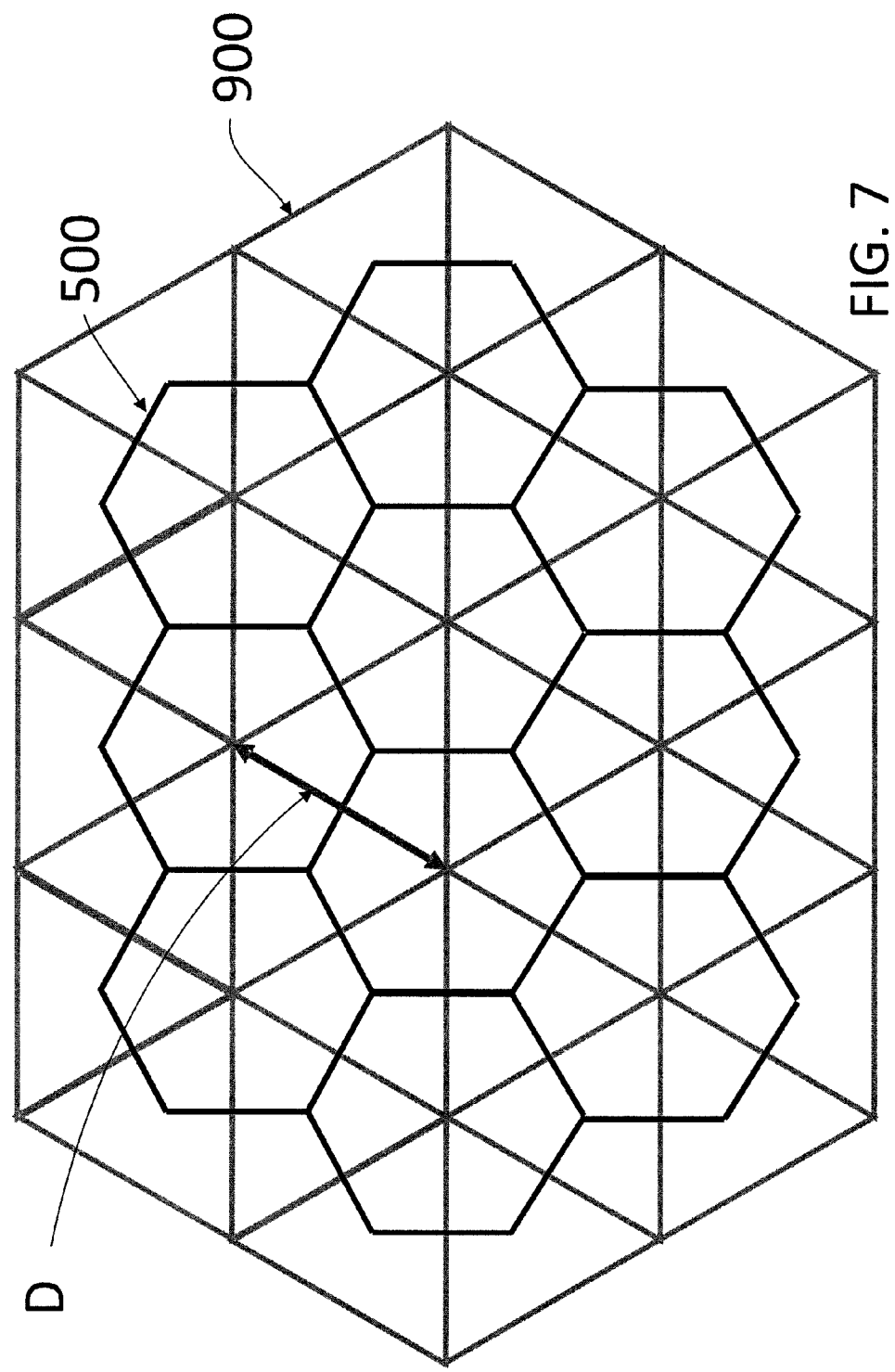
FIG. 7 shows a hexagonal pattern of conducting grid and triangular pattern of background grid, in accordance with an embodiment.

The exemplary embodiment discussed herein utilizes a conducting grid with a second "background grid". The two grids can be different shapes, as set forth below. In the following description, the term "cell shape" describes the shape of the grid (e.g. square, rectangle, hexagon, triangle, etc.); "elements" are the sides of the cell shape; and "nodes" are the vertices of the cell shape. With this notation, the background grid can be described as the set of lines that join together the centroids of each cell shape on the conducting grid. Example representations of conducting and background grids are shown in FIG. 5 for a rectangular conducting grid 500 and rectangular background grid 900; FIG. 6 for a triangular conducting grid 500 and hexagonal background grid 900; FIG. 7 for a triangular background grid 900 and hexagonal conducting grid 500, and lastly, FIG. 8 for mixed shape conducting and background grids 500 and 900, respectively.

Figure 8:
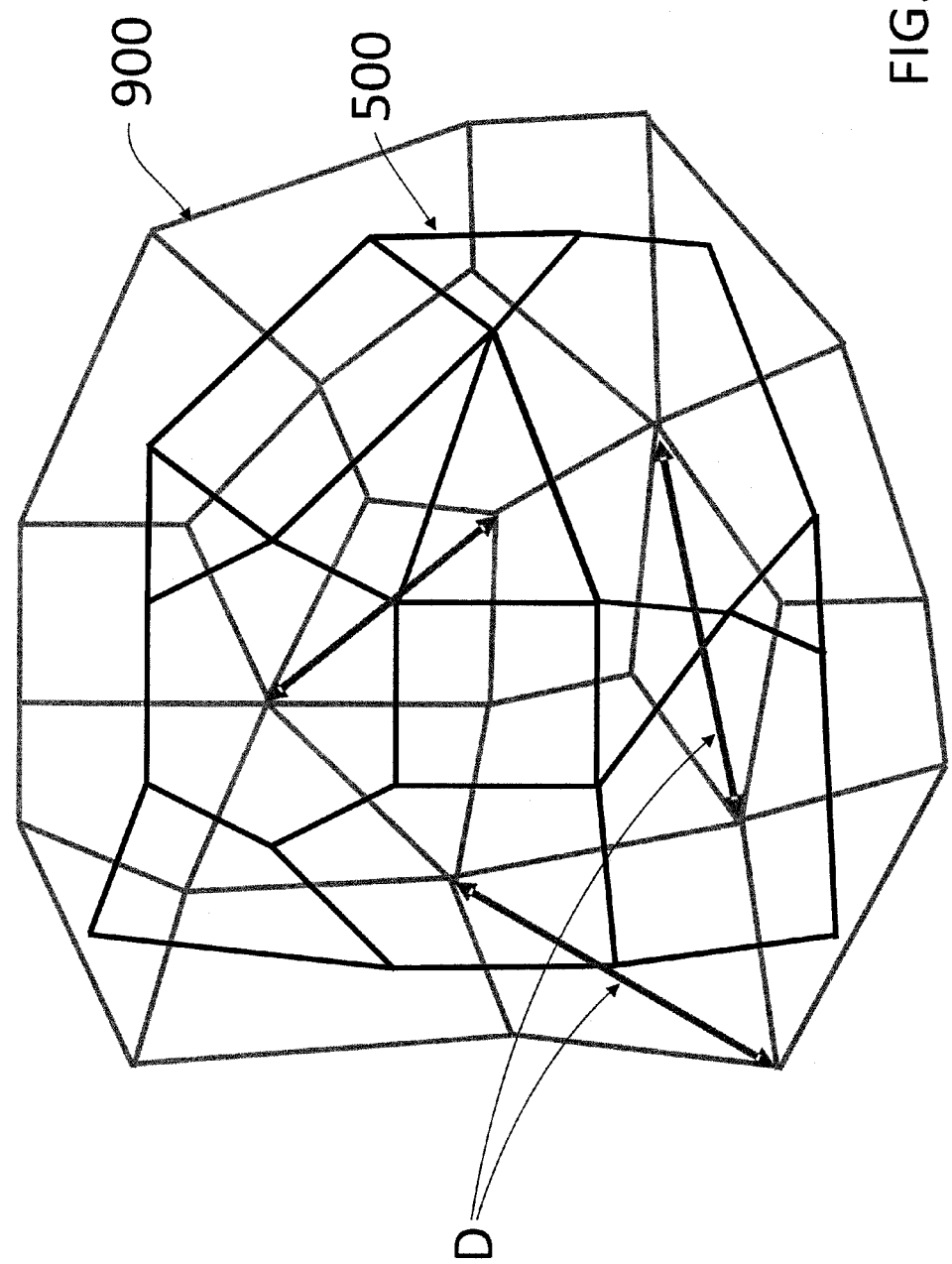
FIG. 8 shows a mixed pattern of conducting and background grids, in accordance with an embodiment.
Figure 9:
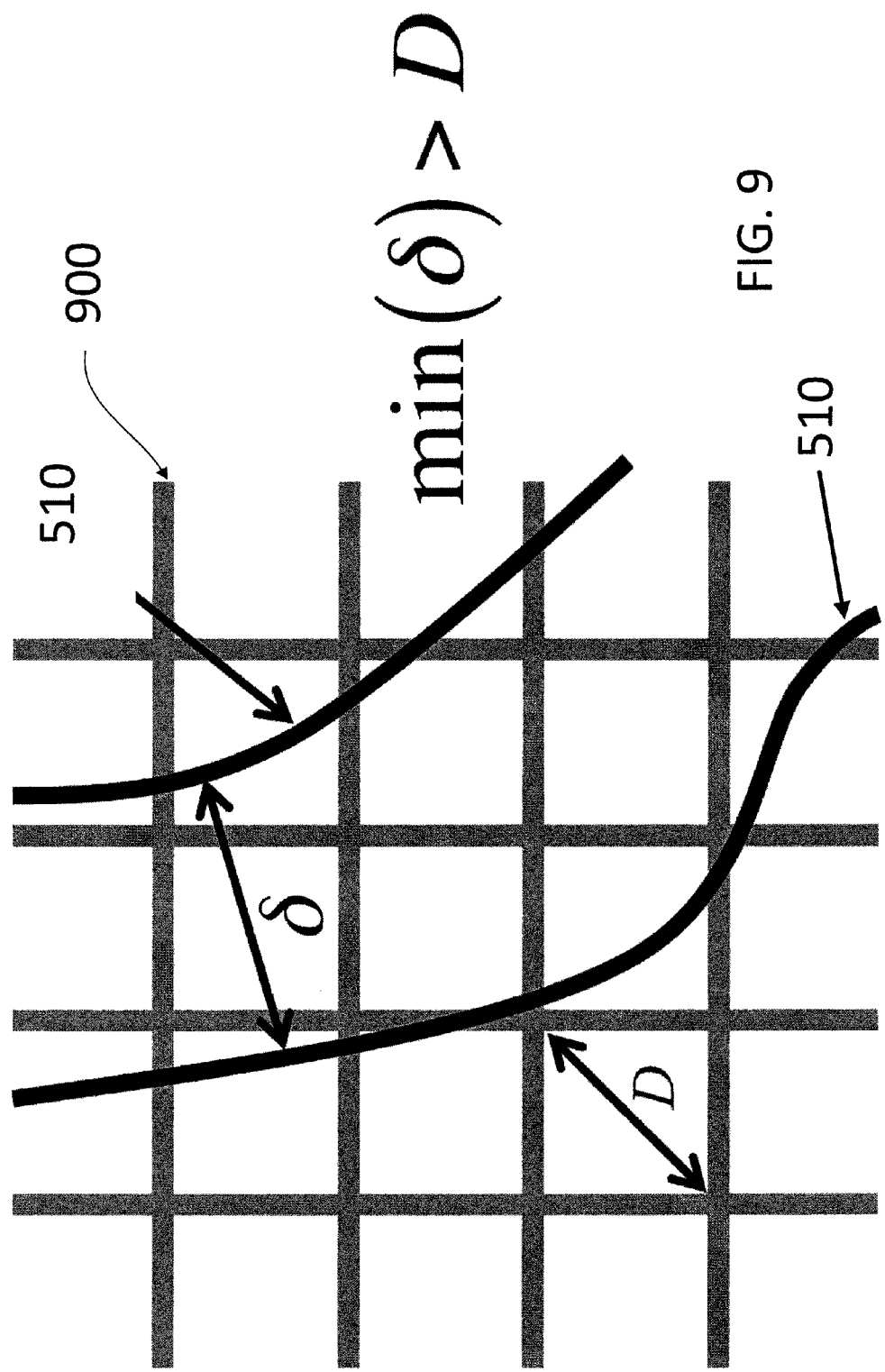
FIG. 9 shows a portion of the background grid in FIG. 5 for generating a discretized electromagnet wire pattern approximating a smooth wire pattern, according to an aspect of the invention.

The elements of the conducting grid can be active (conducting) or inactive (non-conducting). The method set forth below is used to identify which elements should be active that will best represent the smooth wire pattern. With reference to FIG. 9, two current pathways are shown 510 representing portions of a smooth wire pattern. This pattern is superimposed on top of a rectangular background grid at 900. The smooth wire pattern has a minimum separation distance between two current pathways denoted 6. In order for the smooth pattern to be represented by a conducting grid 500, discussed further below, the minimum separation distance must be larger than the maximum distance between the nodes of the background grid 900. In the illustrated example the maximum distance between the nodes of the rectangular background grid is the diagonal, denoted D. For non-rectangular grids, such as depicted in FIGS. 6-8, this distance is shown with a double-sided arrow, also denoted D. It is important to note that for mixed cell shape grids (FIG. 8), the maximum distance between the nodes of the background grid 900 (and hence the limit for the minimum separation between two current pathways on the smooth wire pattern) will vary depending on the density and shape of the grid. Therefore, the grid can be discretized more finely in certain areas that require a smoother representation of the original wire pattern or where the minimum separation between two current pathways must be small.

To achieve the required minimum separation between conductors imposed by the grid discretization, the number of loops can be reduced in the wire pattern representation of the current density, or a design method can be used that distinctly incorporates a minimum wire separation distance into its optimization (see Poole M., et al.: *Minimax current density coil design*, J Phys D Appl Phys; 43: 095001 or Harris C. T., et al.: *Electromagnet design allowing explicit and simultaneous control of minimum wire spacing and field uniformity*, Concept Magn Reson B; 41B(4): 120-129).

Figure 10:
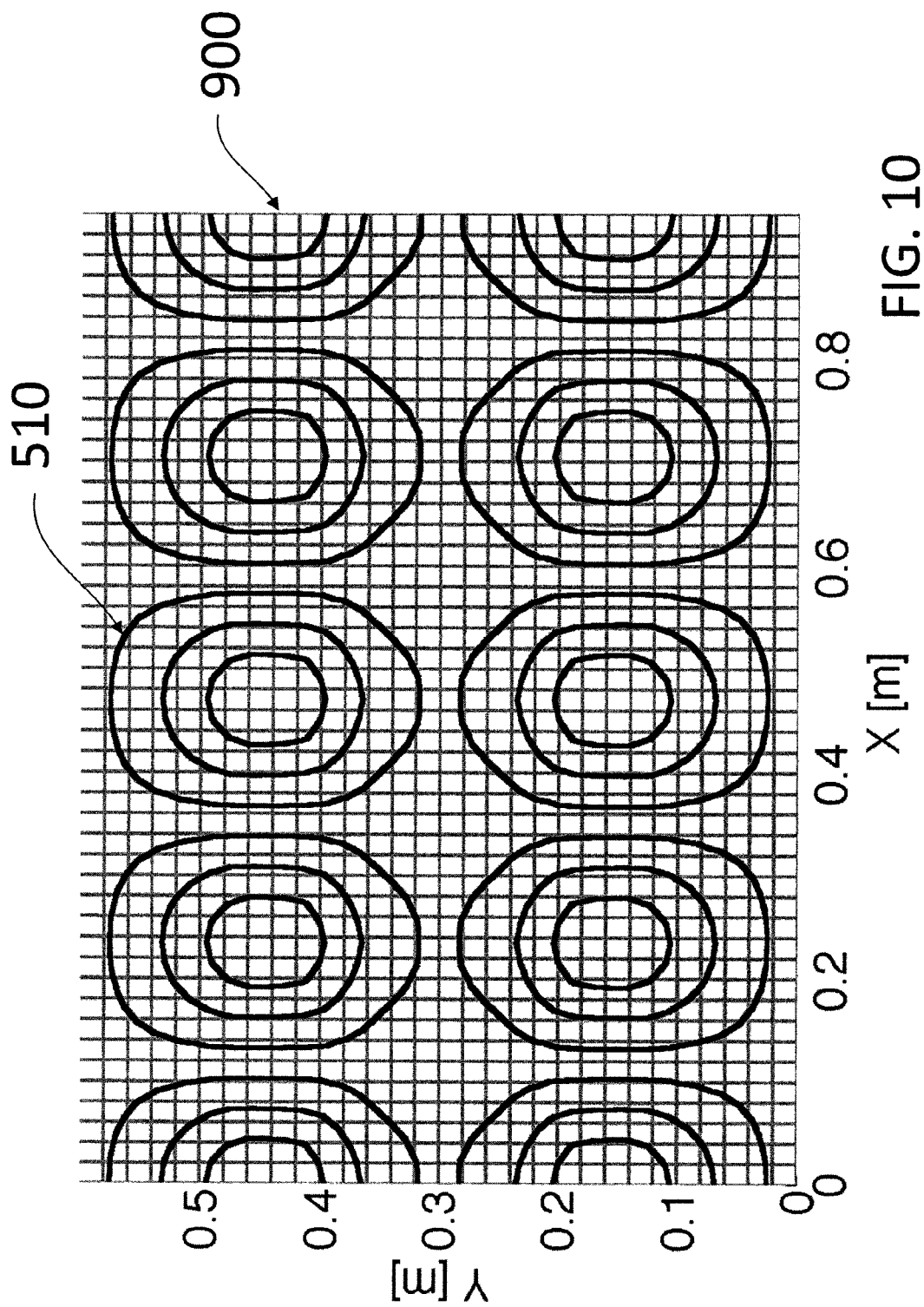
FIG. 10 shows an exemplary rectangular background grid onto which the smooth wire pattern has been superimposed.
Figure 11:
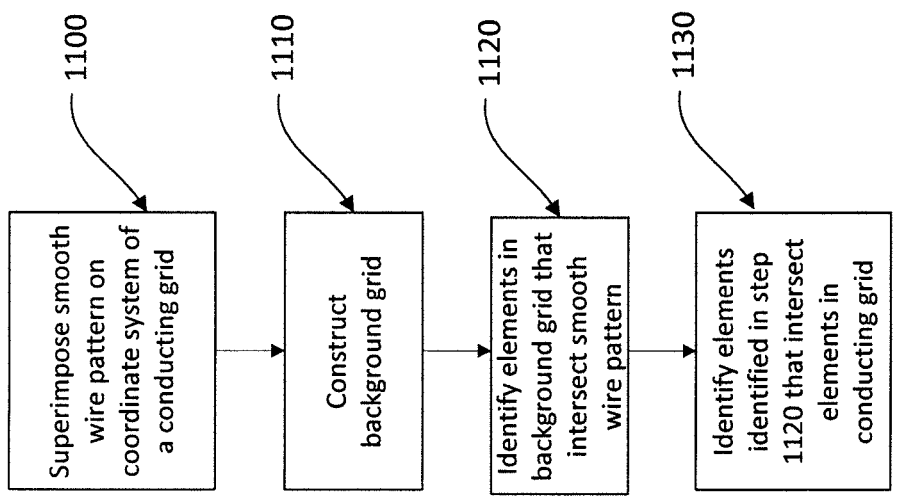
FIG. 11 is a flowchart showing steps in an exemplary method for transforming the smooth wire pattern to a discretized wire pattern on the rectangular conducting grid, in accordance with an embodiment.

FIG. 10 displays a smooth wire pattern 510 that is to be represented by a rectangular conducting grid. The smooth wire pattern is shown super-imposed on top of the background grid 900 described previously. FIG. 11 shows steps for representing the smooth wire pattern by the conducting grid. At step 1100, the smooth wire pattern is super-imposed onto the coordinate system of the conducting grid. In the illustrated example this step entails transforming from the 3D Cartesian coordinates of the smooth wire pattern to Polar coordinates, where the azimuthal angle $\theta$ is the local x surface-coordinate and z is the local y surface-coordinate. According to this exemplary embodiment, the conducting grid is a 2 cm×2 cm square grid of conducting pathways in the xy-plane (in surface coordinates, or $\theta$z-plane in polar coordinates) spanning a total area of 94 cm×60 cm in the x- and y-directions, respectively. This corresponds to a cylindrical surface with radius of approximately 14.95 cm and total length of 60 cm that has been "unwrapped" so that the planar x-direction corresponds to the azimuthal direction in polar coordinates and the planar y-direction corresponds to the z-direction in polar coordinates.

Figure 12:
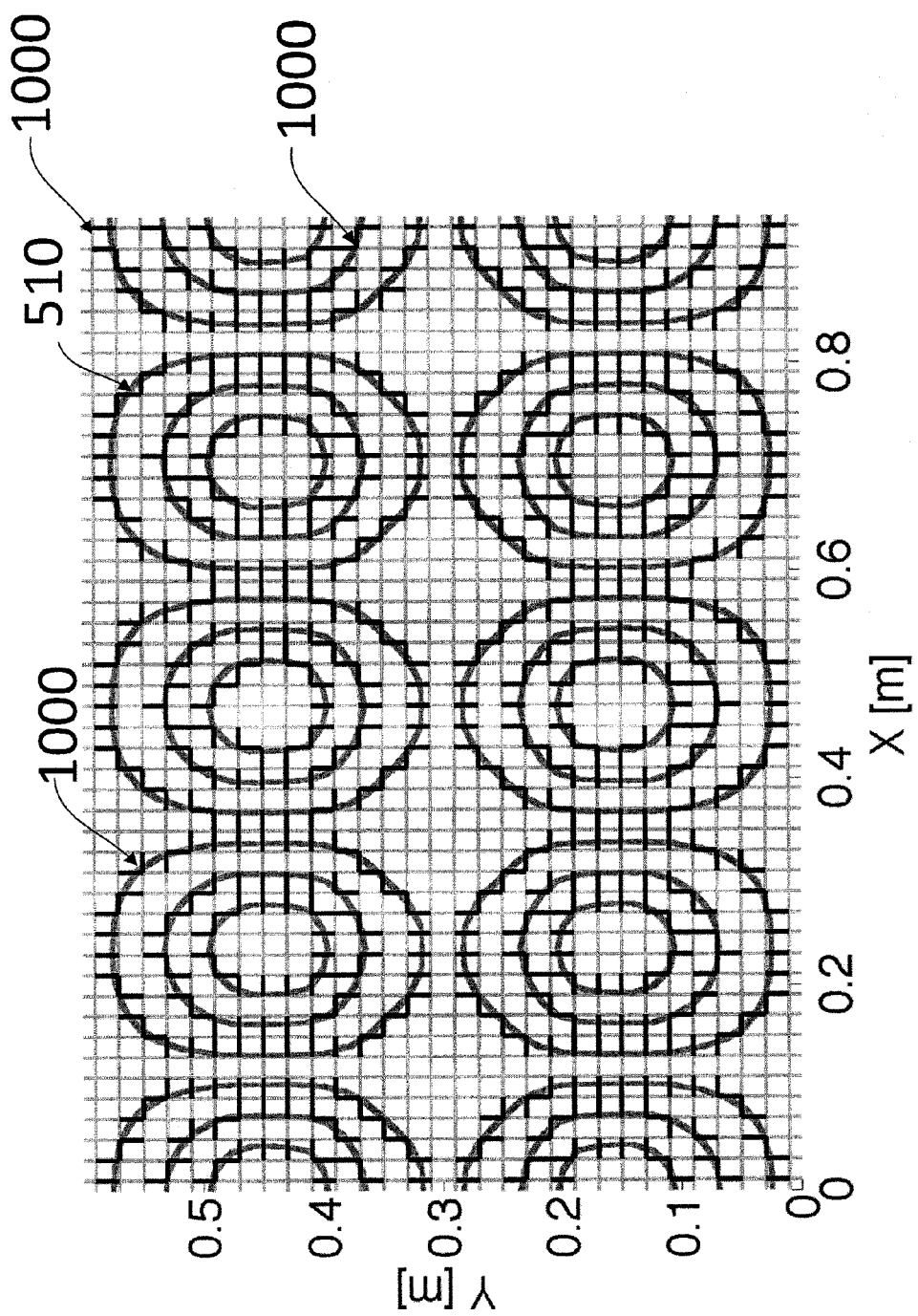
FIG. 12 shows elements in the background grid that intersect with the smooth wire pattern, in accordance with an embodiment.
Figure 13:
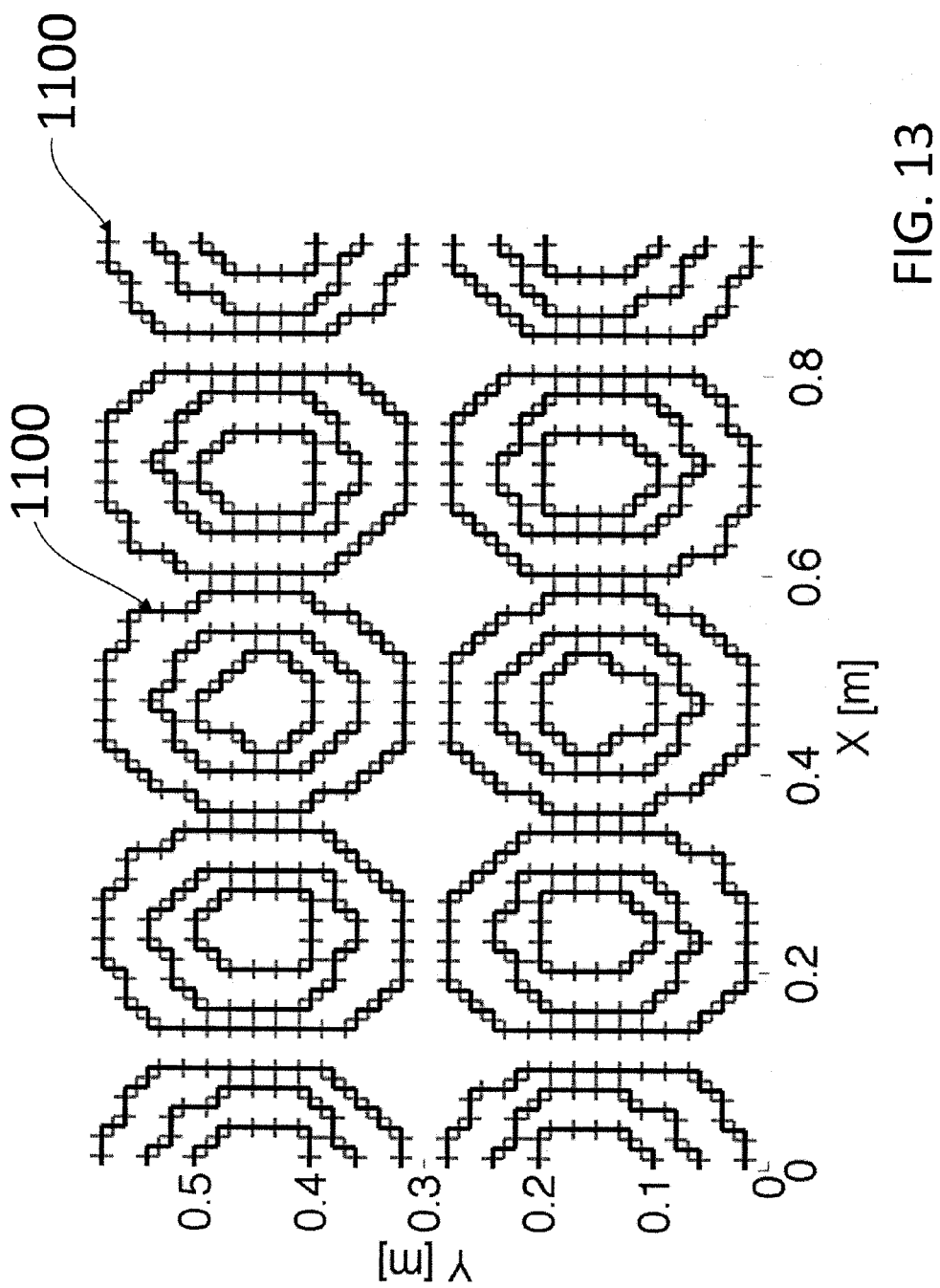
FIG. 13 shows elements of the rectangular conducting grid that intersect with the background grid elements of FIG. 12, in accordance with an embodiment.
Figure 14:
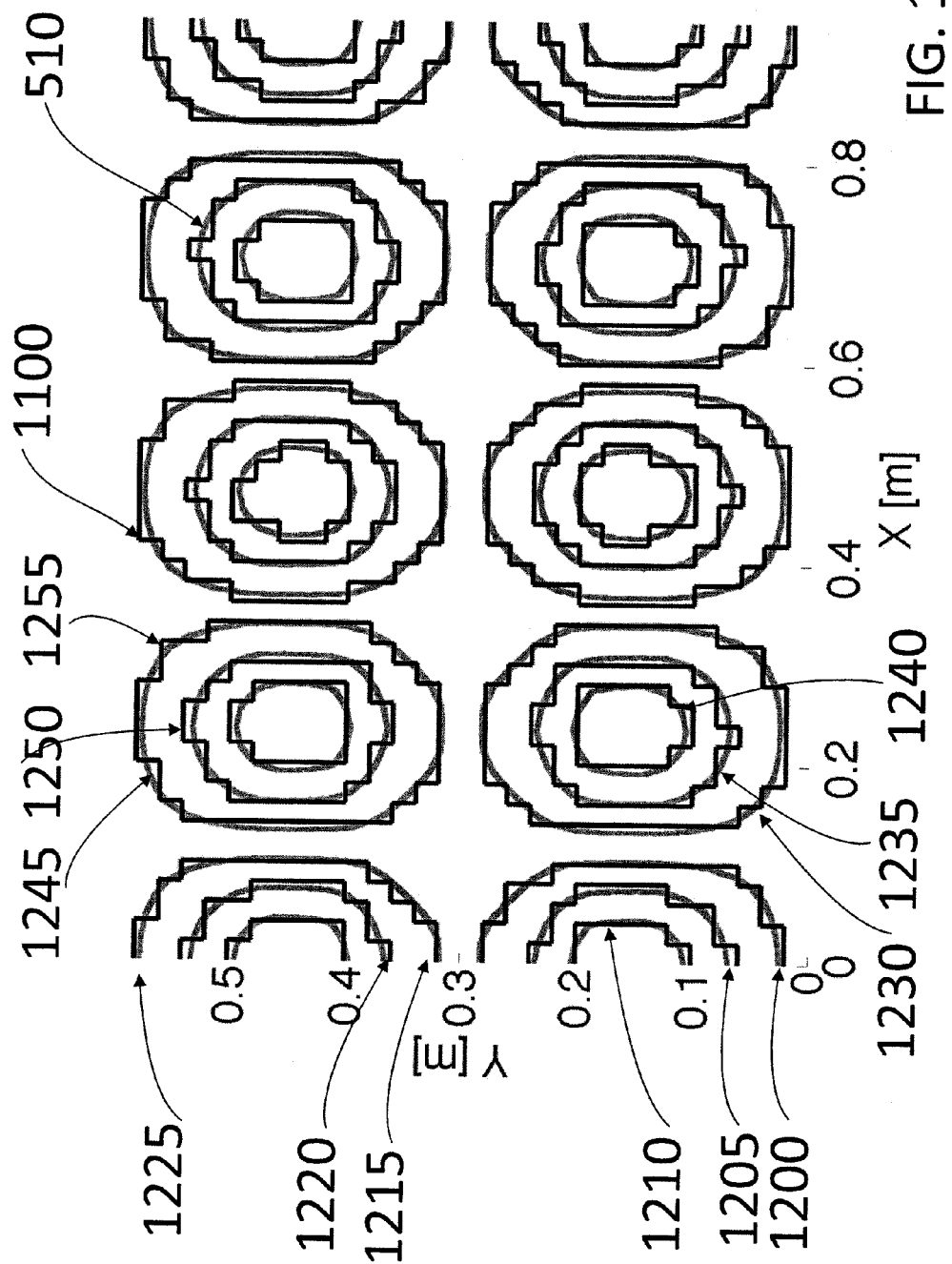
FIG. 14 shows elements of the rectangular conducting grid forming current loops for generating a discretized wire pattern approximating the smooth wire pattern, according to an aspect of the invention.
Figure 15:
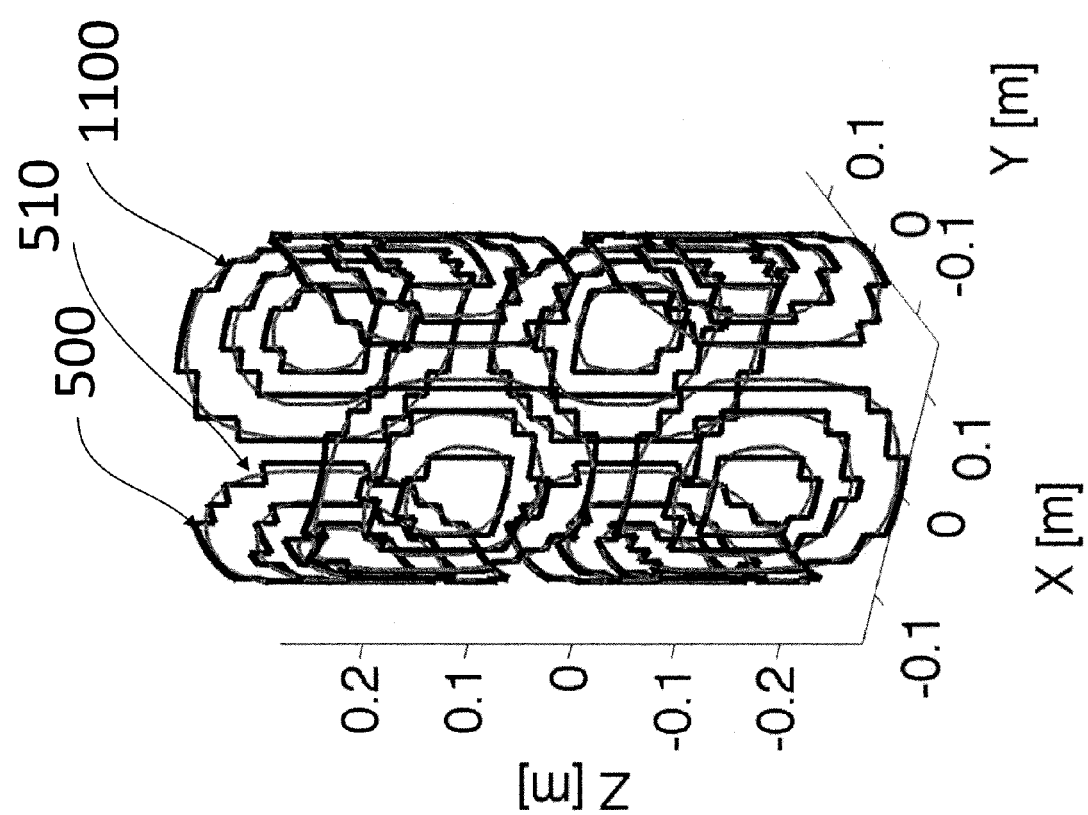
FIG. 15 shows both the smooth and discretized patterns transformed from a two-dimensional representation to a cylinder.
Figure 16:
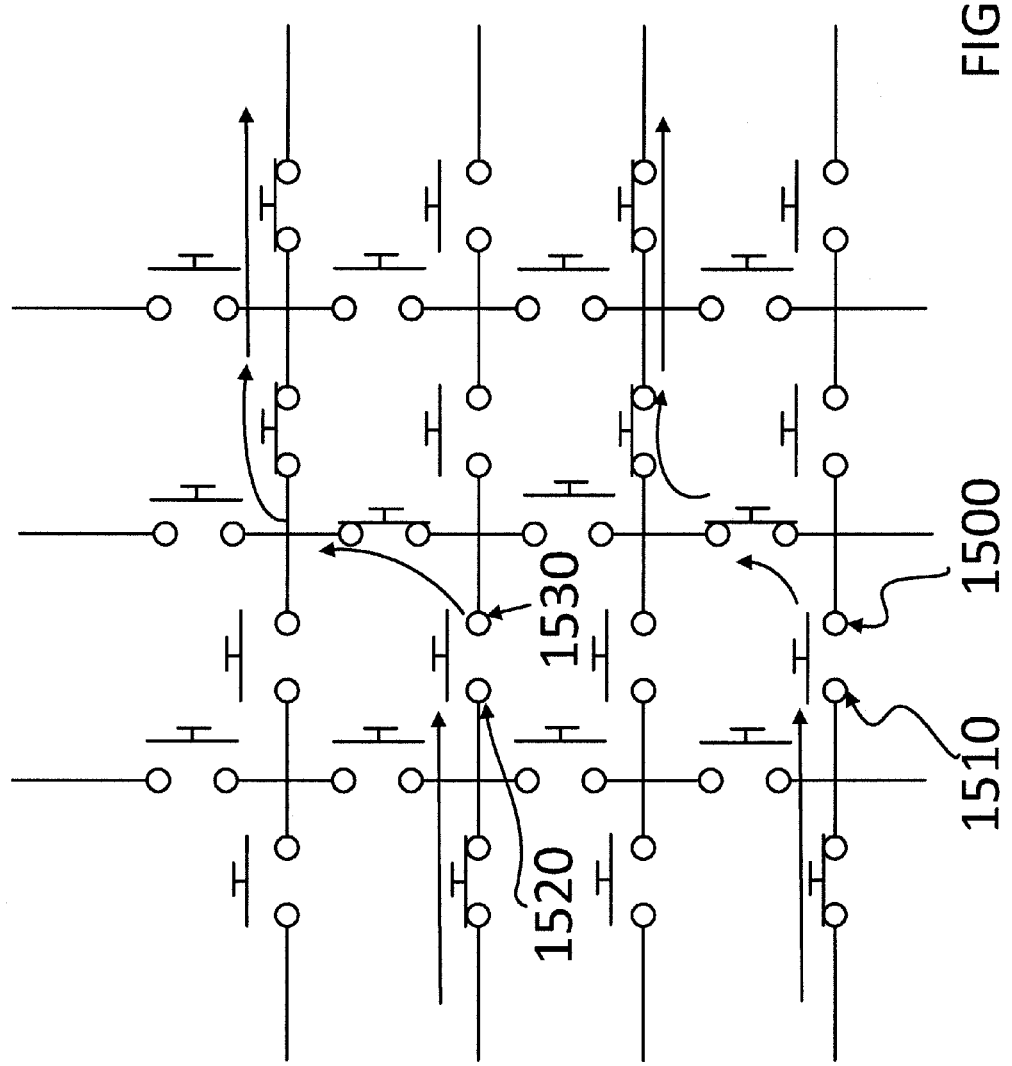
FIG. 16 shows a detail of the lower-left portion of the rectangular conducting grid with conducting switches at each element.
Figure 17:
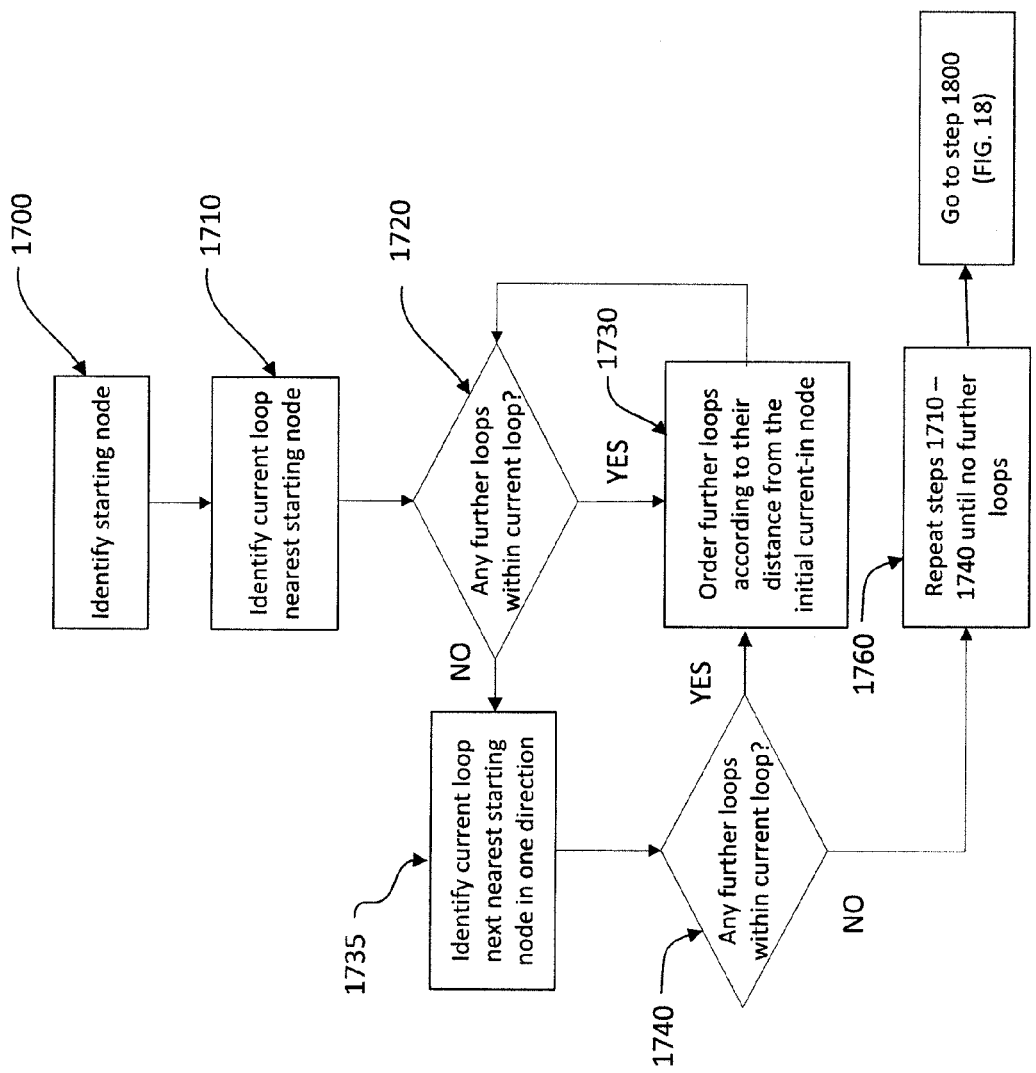
FIGS. 17 and 18 comprise a flowchart showing steps for identifying current-in and current-out nodes for the current loops shown in FIGS. 12 and 13, according to an aspect of the invention.

At step 1110, the background grid 900 is constructed. For this exemplary case the background grid has the same discretization size as the conducting grid 500 (i.e. 2 cm×2 cm grid), and offset by exactly one half-grid spacing (1 cm) in both the x- and y-directions, as shown in FIG. 5. Next, at step 1120, wire elements 1000 in the background grid 900 that intersect with the smooth pattern 510 are identified, as shown in FIG. 12. Then, at 1130, once the highlighted elements 1000 (that is, elements in the background grid that intersect the smooth wire pattern) have been identified, the elements 1100 of the conducting grid 500 that intersect with the highlighted elements 1000 of the background grid are identified, as shown in FIG. 13. The elements 1100 form a set of grid current loops 1200-1255, etc., that best represent the smooth wire pattern, as shown in FIG. 14, wherein the grid current loops are super-imposed on the smooth wire pattern representation 510. FIG. 15 shows both the smooth and discretized patterns transformed from the unwrapped plane in polar coordinates to a cylinder in Cartesian coordinates. FIG. 16 shows a detail of the lower-left portion of grid 500 with switches at each element.

Care must be taken to ensure that the specified current direction for the discretized grid pattern 1100 is the same as the smooth wire pattern 510 by, for example, performing a dot product between the intersecting element from the smooth wire pattern and the representative element in the grid.

The method of FIG. 11 maintains separation between loops (i.e. there is no connection from loop to loop). Depending on how the electromagnet is driven, connections between loops may or may not be needed. In some circumstances it may be desirable to have connections between loops, which can be accomplished many ways. In one example implementation this can be done by identifying "current-in" and "current-out" nodes and then connecting the current-in and current-out nodes, as set forth in FIGS. 17 and 18.

Figure 19:
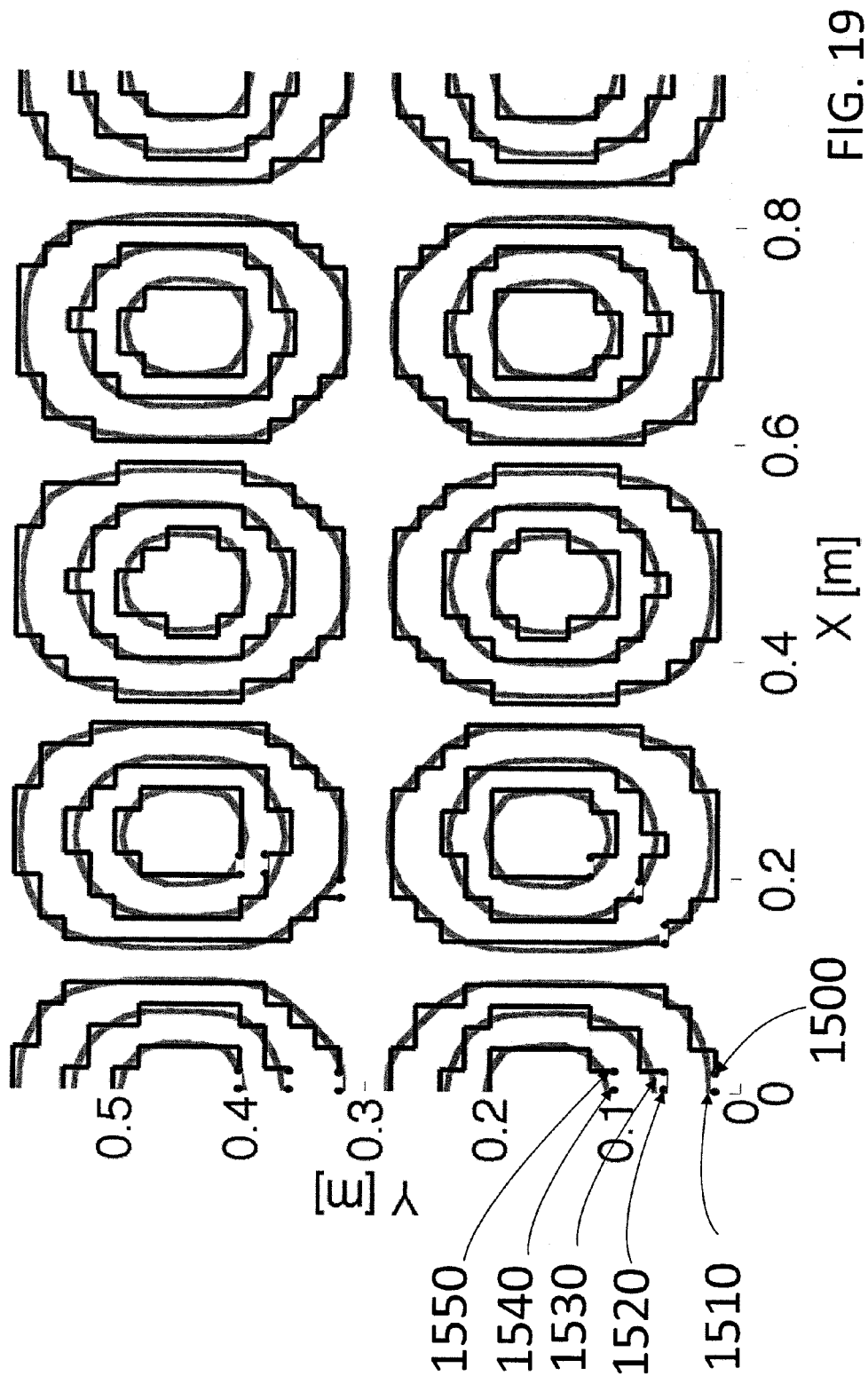
FIG. 19 shows the current-in and current-out nodes identified according to the method of FIGS. 17 and 18, according to an aspect of the invention.

At step 1700, an initial starting node 1510 for the "current-in" (i.e. the current from the amplifier) is specified. As shown in FIG. 19, the starting current input node 1510 is chosen to be the bottom left-most node of the grid 500. At 1710, the loop that is nearest to the initial current-in node 1510 in the x-direction is identified. In general there can be a series of loops that have the same distance to the starting node in the x-direction (e.g. loops 1200-1225), when this occurs one must select the starting loop based on secondary criteria (e.g. closest in the y-direction). Therefore, in this example, the initial loop will be 1200. Next, at step 1720, a determination is made as to whether any of the remaining loops fall within the initial loop, and, if so, proceeds to step 1730 ordering them according to their distance from the initial current-in node by the previously described criteria (e.g. the order would be 1205, 1210). Then, if no further current loops remain within the initial loop 1200 (i.e. a NO branch at step 1720), the loop 1215 that is next nearest to the initial current-in node 1510 is identified (step 1735). Successive loops 1220-1225 are likewise identified (steps 1720-1740) until no further loops remain that are equidistant from the starting node 1510 in the x-direction. Then (step 1760), the process repeats at 1710, identifying the next set of loops that are nearest to the starting node, excluding the loops that have already been ordered until there are no further loops. In this example the next set of loops will be ordered as 1230, 1235, 1240, 1245, 1250, 1255, etc.

Figure 18:
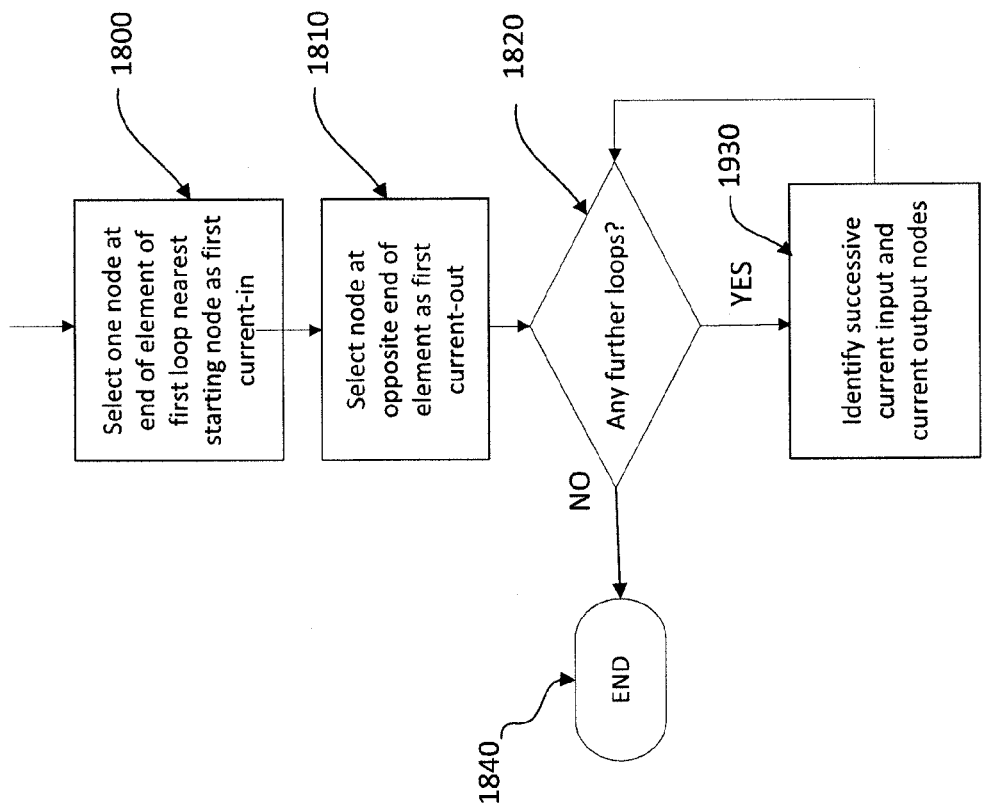

Steps for identifying current input and current output nodes for each loop are set forth in FIG. 18. At 1800, the element of the first loop of the previously ordered set that is nearest to the starting node 1510 is identified (e.g. in the illustrated embodiment this is the element that joins nodes 1510 and 1500), and selecting one of the nodes at the end of this element as the current in and, at 1810, one as the current out depending on the direction of current flow through the loop. In this example, the current in node is 1510 and the current out node is 1500. This process is repeated for the successive closest loops until all loops have current-in and current-out nodes (1520-1550, etc.) associated with them (steps 1820-1840). The final current-out node is the node that is connected to the power amplifier (e.g. in the far right corner of the grid 500). FIG. 19 displays the current-in and current-out nodes for the first twelve loops of the exemplary grid shown in FIGS. 14 and 15. It should be noted that after the current-in and current-out nodes for a particular loop have been identified, the element in the loop that joins the nodes together is removed (i.e. the switch on the element is opened), as shown in FIG. 16.

Having described a method for creating a discretized wire pattern as well as an algorithm to select the current in and current out nodes for each loop, a method and circuit for supplying power to the conducting grid is now set forth for producing the desired current distribution.

Figure 20:
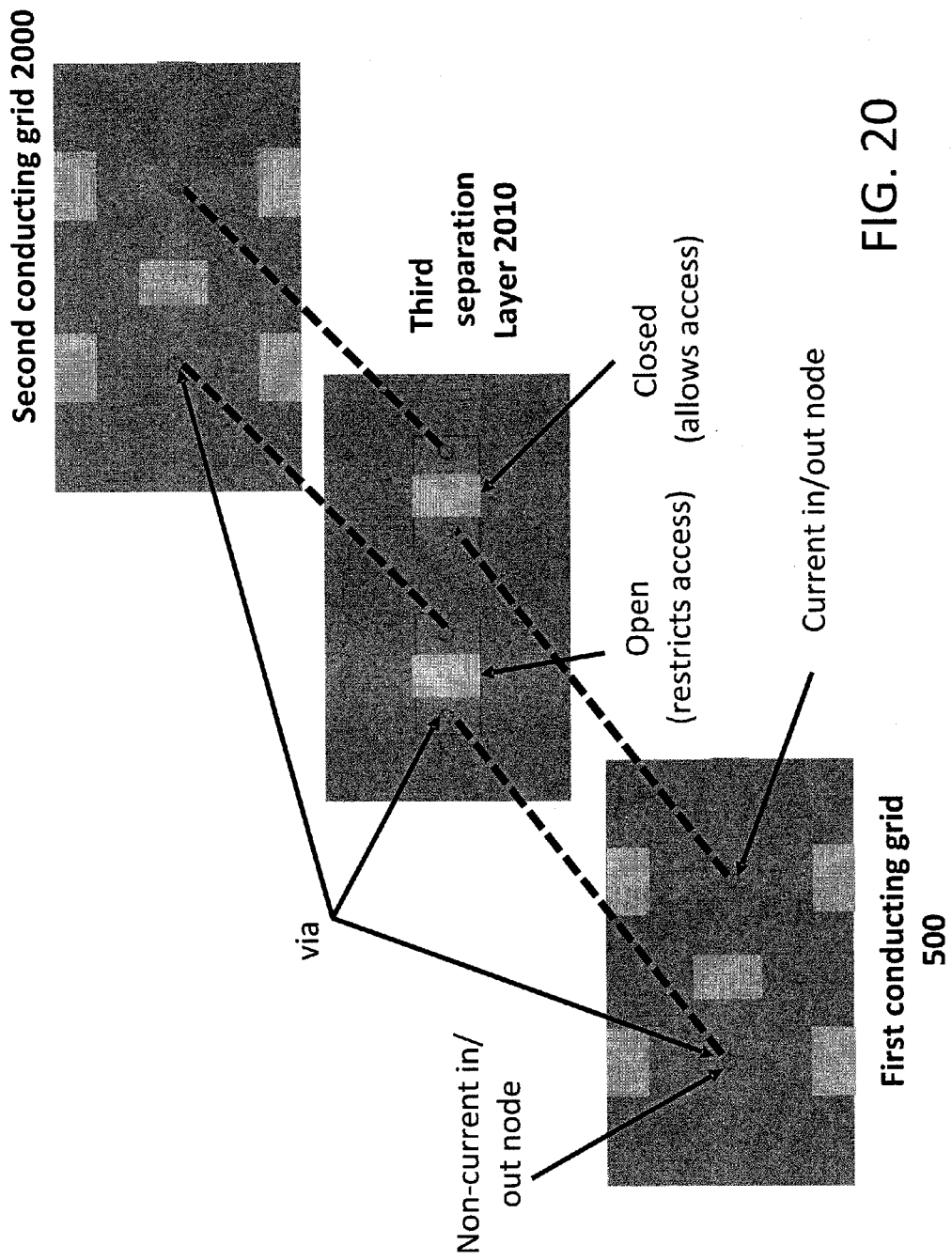
FIG. 20 shows a system for supplying power to a second conducting grid via an intermediate third layer.

In one hardware implementation, a single power-in node and a single power-out node are provided for connecting the power supply to the conducting grid 500. In one embodiment, depicted in FIG. 20, the connections between loops are made via a second grid layer 2000, while connection between the first and second grid layers is made via a third layer 2010 placed between the first and second layers for separating all nodes of the first and second layers other than nodes that correspond to a "current-in" or "current-out" node as described above. This third, separation layer 2010, can have a switch located between the nodes of the two conducting layers, wherein the switch is closed if the node corresponds to a current in or current out node and is otherwise open, as shown in FIG. 20. It should be noted that placement of the single power-in and power-out nodes can be arbitrarily set, and their positions can be varied depending on the desired current pattern.

An alternate embodiment to FIG. 20 is illustrated in FIG. 23 which shows a system for supplying power to a second conducting grid via an intermediate third layer where all switches are on the same surface. One benefit of this implementation is that it saves on space. For example, if all switches are on the top surface, it would allow for the backside (bottom surface) of a multilayer conductor to be used to route the control signals for the switches.

Although the foregoing implementation requires only a single amplifier, the grid network may be split into multiple areas each with a single power-in and power-out node with a corresponding power supply thereby allowing for additional flexibility in producing field profiles.

According to another embodiment, each loop may be assigned a current-in and current-out node independently of the other loops in the desired pattern. In this implementation connections between loops are not needed thereby reducing the number of required grid surfaces. According to this embodiment, each element of the conducting grid 500 may operate as a combined current-in and current-out line for a given loop. Thus, for a given loop 1200, the element joining nodes 1500 and 1510 serves as the current-in line to the loop, the switches on the conducting grid 500 cause current to flow around the loop back to this element and then flow back down a separate pathway out of the grid to the return terminal of the power supply. The switch placed on this element (i.e. the switch separating nodes 1500 and 1510 is open, thereby restricting current to flow directly from the current-in line to the current-out line without first flowing around the loop. Each loop 1200-1255, etc. requires one such combined current-in/current-out node and a separate power supply (or a circuit to equally divide the current source from a single power supply to each loop), but connections between loops are not required. In a current dividing implementation it should be noted that the amount of current delivered to each loop need not be the same (i.e. one loop can receive 1 A and the next loop can receive 2 A), permitting comparable performance to a "multi-coil" approach with greater flexibility over the choice of basis current loop shape.

Figure 21:
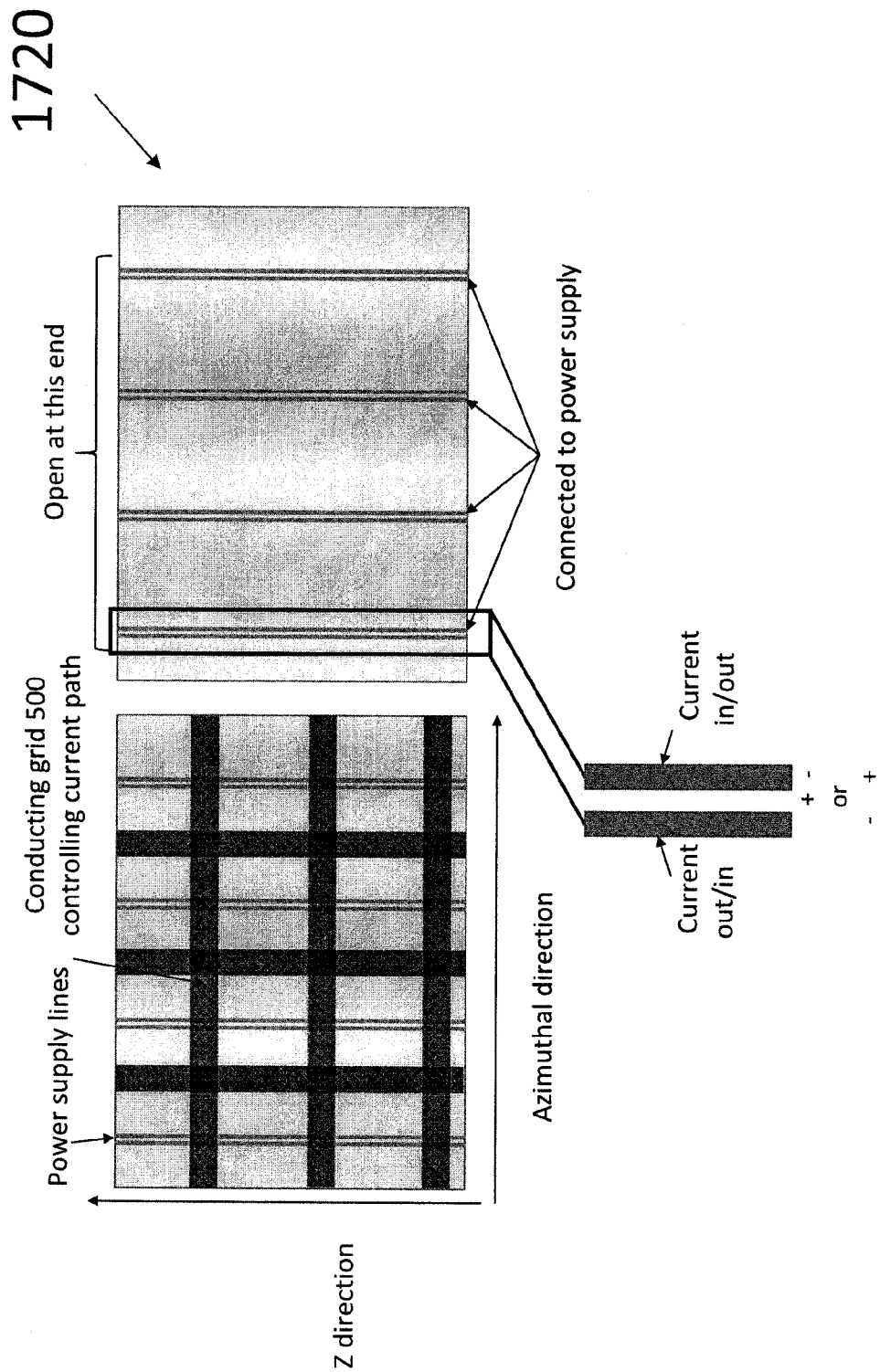
FIGS. 21 and 22 show circuits for applying power to the rectangular conducting grid, according to an aspect of the invention.
Figure 22:
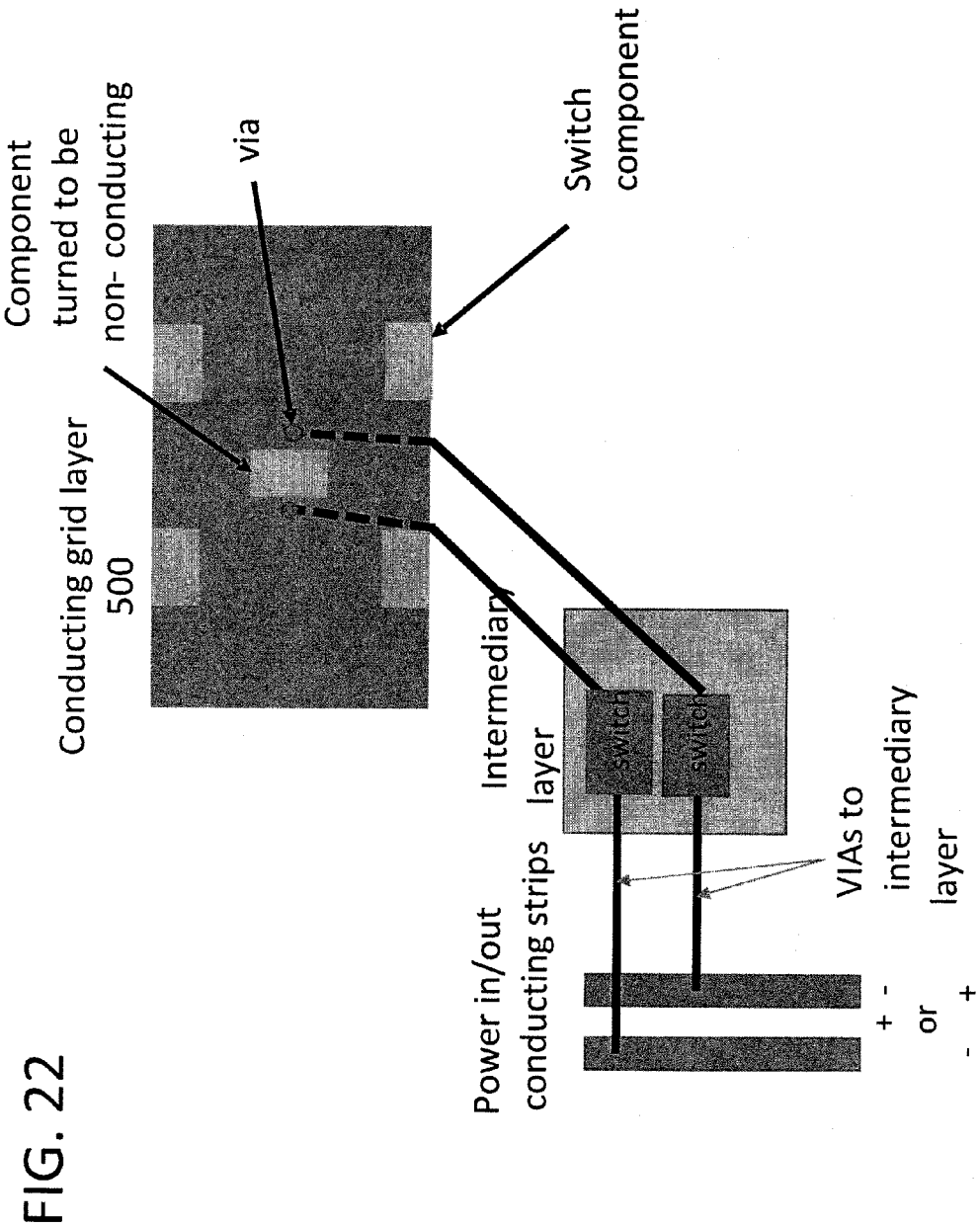

One example of an implementation of the foregoing embodiment is shown in FIGS. 21 and 22. A square conducting grid 500 is provided on one surface of a cylinder, as set forth above (see FIG. 15). The grid contains switches on the elements between its nodes, which control the current pathway over that grid. The current pathway is identified by the methods described previously. Two strips of conducting material are distributed in the azimuthal direction and oriented in the z-direction on a second surface 1720 at the same spacing as the conducting grid on the first surface but offset half the grid spacing so as to be centered on the switches connecting the nodes of the grid. One end of the conducting strips is connected to a power supply (i.e. one strip connected to the positive terminal and the other connected to the negative terminal) and the other end is unconnected to create an open circuit. At each z-position where an element occurs (i.e. where a switch is placed on the conducting grid 500) there are two vertical vias on either side of the switch (FIG. 22) that allow current to flow from the two conducting strips on layer 1720 to the conducting grid 500 on the underlying layer. Within these vias (or on an intermediary layer between the two layers) there is a switch on each line that can either be open or closed. Before the current pathway is determined, all switches on the intermediary layer are open. Once a current loop has been determined, a current in/out element is selected on the loop and the switches for that element are closed thereby allowing current to flow from the power supply to one side of that element, through the loop to the other side of the element and back to the power supply. For simplicity, one can restrict the opening and closing of the switches so that only one element is open for each longitudinal pair of conducting strips. The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

We claim:

1. A method of configuring a conducting grid of elements interconnected at intersecting nodes by switches, for generating a dynamically changeable current distribution represented in two dimensions on said conducting grid by a smooth pattern of loops, to create a time varying magnetic field profile within a region of interest in an MRI system, comprising:
   constructing a background grid to said conducting grid by connection of centroids of the cell shape of the conducting grid;
   identifying a subset of elements in said background grid that intersect said smooth pattern of loops;
   identifying a subset of elements in said conducting grid that intersect said subset of elements in the background grid, wherein said subset of elements in said conducting grid forms a discretized pattern of loops representing said smooth pattern of loops;
   for each of said discretized pattern of loops identifying input and output current nodes;
   altering the on-off state of individual switches in accordance with said discretized pattern of loops;
   opening the switch between each respective pair of input and output current nodes; and
   applying power to said conducting grid via at least one pair of said input and output current nodes such that the current flow through said elements generates said magnetic field profile.

2. The method of claim 1, further comprising interconnecting respective ones of said discretized pattern of loops via said input and output current nodes.

3. The method of claim 1, wherein identifying input and output current nodes further comprises:
   identifying an initial current-in node for receiving said power;
   ordering said discretized pattern of loops based on distance from said initial current-in node; and
   identifying a current-in and current-out node for each successive loop in said ordering.

4. An adaptive electromagnet, comprising:
   an array of conducting grid elements for generating a time varying magnetic field profile within a region of interest in an MRI system;
   a plurality of switches interconnecting said conducting grid of elements at intersecting nodes for generating a dynamically changeable current distribution represented in two dimensions on said array of conducting grid elements by a smooth pattern of loops;
   a background grid constructed to said array of conducting grid elements by connection of centroids of the cell shape of the array of conducting grid elements, wherein a subset of elements in said background grid intersect said smooth pattern of loops and a subset of elements in said array of conducting grid elements intersect said subset of elements in the background grid such that said subset of elements in said conducting grid forms a discretized pattern of loops representing said smooth pattern of loops; and
   input and output current nodes for each of said discretized pattern of loops;
   wherein upon (i) altering the on-off state of individual switches in accordance with said discretized pattern of loops, (ii) opening the switch between each respective pair of input and output current nodes, and (iii) applying power to said conducting grid via at least one pair of said input and output current nodes, current flows through said elements to generate said magnetic field profile, and wherein said switches are transistor switches.

5. The adaptive electromagnet of claim 4, wherein said elements are arranged in a rectangular grid comprising a plurality of horizontal and vertical wire conductors that intersect at said plurality of nodes.

6. The adaptive electromagnet of claim 4, wherein the input input current node of at least one loop is connected to a corresponding output current node of a next loop via a second conductive grid.

7. The method of claim 1, wherein applying power to said array further comprises:
   assigning each loop a combined current-in and current-out element; and
   connecting a separate source of power to each respective combined current-in and current-out element.

8. An adaptive electromagnet, comprising:
   an array of conducting grid elements for generating a time varying magnetic field profile within a region of interest in an MRI system;

a plurality of switches interconnecting said conducting grid of elements at intersecting nodes for generating a dynamically changeable current distribution represented in two dimensions on said array of conducting grid elements by a smooth pattern of loops;

a background grid constructed to said array of conducting grid elements by connection of centroids of the cell shape of the array of conducting grid elements, wherein a subset of elements in said background grid intersect said smooth pattern of loops and a subset of elements in said array of conducting grid elements intersect said subset of elements in the background grid such that said subset of elements in said conducting grid forms a discretized pattern of loops representing said smooth pattern of loops;

a combined current-in and current-out element for each of said discretized pattern of loops;

a separate source of power to each respective combined current-in and current-out element;

wherein upon (i) altering the on-off state of individual switches in accordance with said discretized pattern of loops, (ii) opening the switch between each respective combined current-in and current-out element, and (iii) applying power to said conducting grid via one said respective combined current-in and current-out element, current flows through said grid elements to generate said magnetic field profile, and, wherein the source of power comprises a power supply.

9. An adaptive electromagnet, comprising:

an array of conducting grid elements for generating a time varying magnetic field profile within a region of interest in an MRI system;

a plurality of switches interconnecting said conducting grid of elements at intersecting nodes for generating a dynamically changeable current distribution represented in two dimensions on said array of conducting grid elements by a smooth pattern of loops;

a background grid constructed to said array of conducting grid elements by connection of centroids of the cell shape of the array of conducting grid elements, wherein a subset of elements in said background grid intersect said smooth pattern of loops and a subset of elements in said array of conducting grid elements intersect said subset of elements in the background grid such that said subset of elements in said conducting grid forms a discretized pattern of loops representing said smooth pattern of loops;

a combined current-in and current-out element for each of said discretized pattern of loops;

a separate source of power to each respective combined current-in and current-out element;

wherein upon (i) altering the on-off state of individual switches in accordance with said discretized pattern of loops, (ii) opening the switch between each respective combined current-in and current-out element, and (iii) applying power to said conducting grid via one said respective combined current-in and current-out element, current flows through said grid elements to generate said magnetic field profile, and wherein the source of power comprises a single power supply and a circuit to divide the current from the power supply to each loop via each combined current-in and current-out element.

10. The adaptive electromagnet of claim 9, wherein the amount of current to each loop is equal.

11. The adaptive electromagnet of claim 9, wherein the amount of current to each loop is unequal.

12. The adaptive electromagnet of claim 8, further comprising:

first and second strips of conducting material distributed in the azimuthal direction on a surface adjacent said conductive grid, said strips overlying switches of the conductive grid, one strip being connected at one end to a positive terminal of said power supply and the other strip being connected at said one end to a negative terminal of said power supply and an opposite end of each strip left unconnected to create an open circuit;

a pair of vias at each azimuthal position overlying opposite sides of a switch of said conductive grid for allowing current to flow from the first and second strips of conducting material to said grid array;

a further switch associated with each via adapted to be closed in response to assigning each loop a current-in/current-out element and altering the on-off state of individual switches on said grid array in accordance with said discretized pattern of loops, thereby allowing current to flow from the power supply to one side of the current-in/current-out element, through each said loop and to the other side of the current-in/current-out element then back to the power supply.

13. The adaptive electromagnet of claim 12, wherein said further switch is disposed within said via.

14. The adaptive electromagnet of claim 12, wherein said further switch is disposed in an intermediary layer between said surface and said conductive grid.

15. The adaptive electromagnet of claim 9, further comprising:

first and second strips of conducting material distributed in the azimuthal direction on a surface adjacent said conductive grid, said strips overlying switches of the conductive grid, one strip being connected at one end to a positive terminal of said power supply and the other strip being connected at said one end to a negative terminal of said power supply and an opposite end of each strip left unconnected to create an open circuit;

a pair of vias at each azimuthal position overlying opposite sides of a switch of said conductive grid for allowing current to flow from the first and second strips of conducting material to said grid array;

a further switch associated with each via adapted to be closed in response to assigning each loop a current-in/current-out element and altering the on-off state of individual transistor switches on said grid array in accordance with said discretized pattern of loops, thereby allowing current to flow from the power supply to one side of the current-in node/current out element, through each said loop and to the other side of the current-in/current-out element then back to the power supply.

16. The adaptive electromagnet of claim 15, wherein said further switch is disposed within said via.

17. The adaptive electromagnet of claim 15, wherein said further switch is disposed in an intermediary layer between said surface and said conductive grid.

18. The adaptive electromagnet of claim 16, wherein all switches are located on the same surface.

* * * * *

UNITED STATES PATENT AND TRADEMARK OFFICE
CERTIFICATE OF CORRECTION

| | | |
|---|---|---|
| PATENT NO. | : 9,523,751 B2 | Page 1 of 1 |
| APPLICATION NO. | : 14/898545 | |
| DATED | : December 20, 2016 | |
| INVENTOR(S) | : Chad Tyler Harris | |

It is certified that error appears in the above-identified patent and that said Letters Patent is hereby corrected as shown below:

In the Drawings

In Figure 18: Replace "1930" with --1830--

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*